United States Patent [19]

Mallory et al.

[11] Patent Number: 4,907,931
[45] Date of Patent: Mar. 13, 1990

[54] APPARATUS FOR HANDLING SEMICONDUCTOR WAFERS

[75] Inventors: Chester L. Mallory, Campbell; Edric H. Tong, Santa Cruz; Wayne K. Borglum, San Jose, all of Calif.

[73] Assignee: Prometrix Corporation, Santa Clara, Calif.

[21] Appl. No.: 195,703

[22] Filed: May 18, 1988

[51] Int. Cl.4 ............................................. B65H 5/00
[52] U.S. Cl. .................................. 414/225; 414/416; 414/627; 414/752; 414/757; 414/744.6
[58] Field of Search ............... 414/225, 331, 404, 416, 414/417, 280, 281, 752, 627, 757, 754, 744.4, 744.5, 744.6, 744.7

[56] References Cited

U.S. PATENT DOCUMENTS

| | | | |
|---|---|---|---|
| 3,503,527 | 3/1970 | Devol | 414/783 X |
| 4,103,232 | 7/1978 | Sugita et al. | 414/36 X |
| 4,407,627 | 10/1983 | Sato et al. | 414/754 X |
| 4,441,853 | 4/1984 | Kosugi | 414/757 |
| 4,457,664 | 7/1984 | Judell et al. | 414/757 X |
| 4,655,584 | 4/1987 | Tanaka et al. | 414/225 X |
| 4,695,215 | 9/1987 | Jacoby et al. | 414/225 |
| 4,746,256 | 5/1988 | Boyle et al. | 414/225 X |
| 4,752,898 | 6/1988 | Koenig | 414/754 X |

FOREIGN PATENT DOCUMENTS 0253162 1/1988 European Pat. Off. .

Primary Examiner—Frank E. Werner
Assistant Examiner—Robert S. Katz
Attorney, Agent, or Firm—Flehr, Hohbach, Test, Albritton & Herbert

[57] ABSTRACT

A semiconductor wafer handling apparatus for automated movement of semiconductor wafers between wafer cassette trays and wafer test systems is provided. The apparatus includes a platform for carrying at least one semiconductor wafer cassette tray, a wafer alignment device carried by the platform for aligning a semiconductor wafer in a predetermined test position and a wafer transfer device associated with the platform and the wafer alignment device for transferring the wafer between the cassette tray, the alignment device and the test system. The wafer transfer device is operational in the same plane relative to the platform and capable of extending, retracting and rotating in the plane. In includes a shuttle arm assembly mounted for translational and rotational movement so that it may be selectively aligned with the cassette tray, the alignment device and the test system and further includes a device for controlling the translational and rotational movement of the shuttle arm assembly for selectively extending, retracting the rotating the shuttle arm assembly relative to each of the cassette tray, the alignment device and the test system so that in response to signals from the control device, the shuttle arm assembly can be selectively actuated to translate to a cassette tray position and secure and remove a semiconductor wafer from the cassette tray, translate to a wafer alignment position and insert, release, secure and remove the wafer from the alignment device, and translate and rotate to a wafer test position and place the wafer on, release, secure, and lift the wafer off the test system.

32 Claims, 14 Drawing Sheets

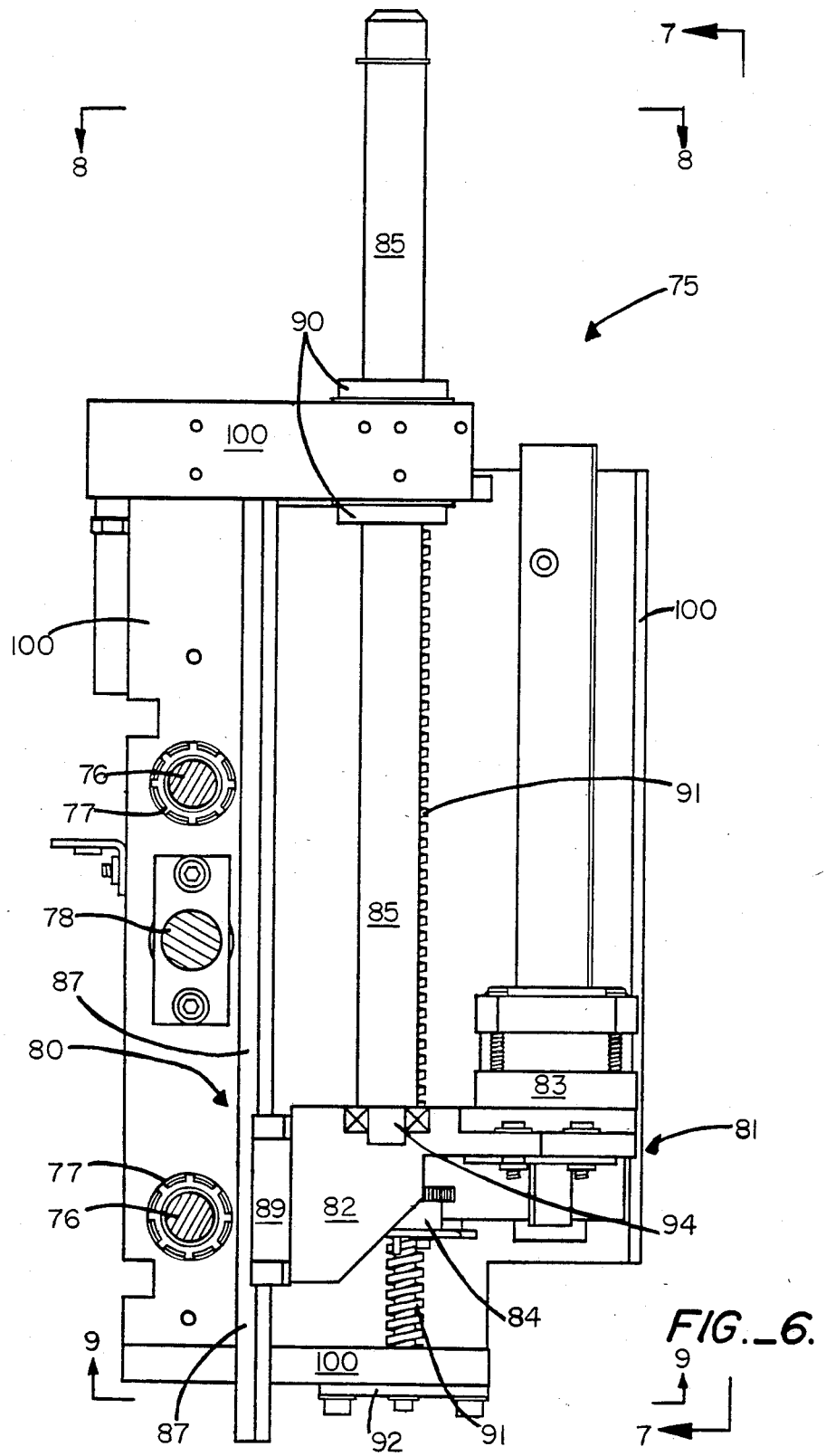
FIG._6.

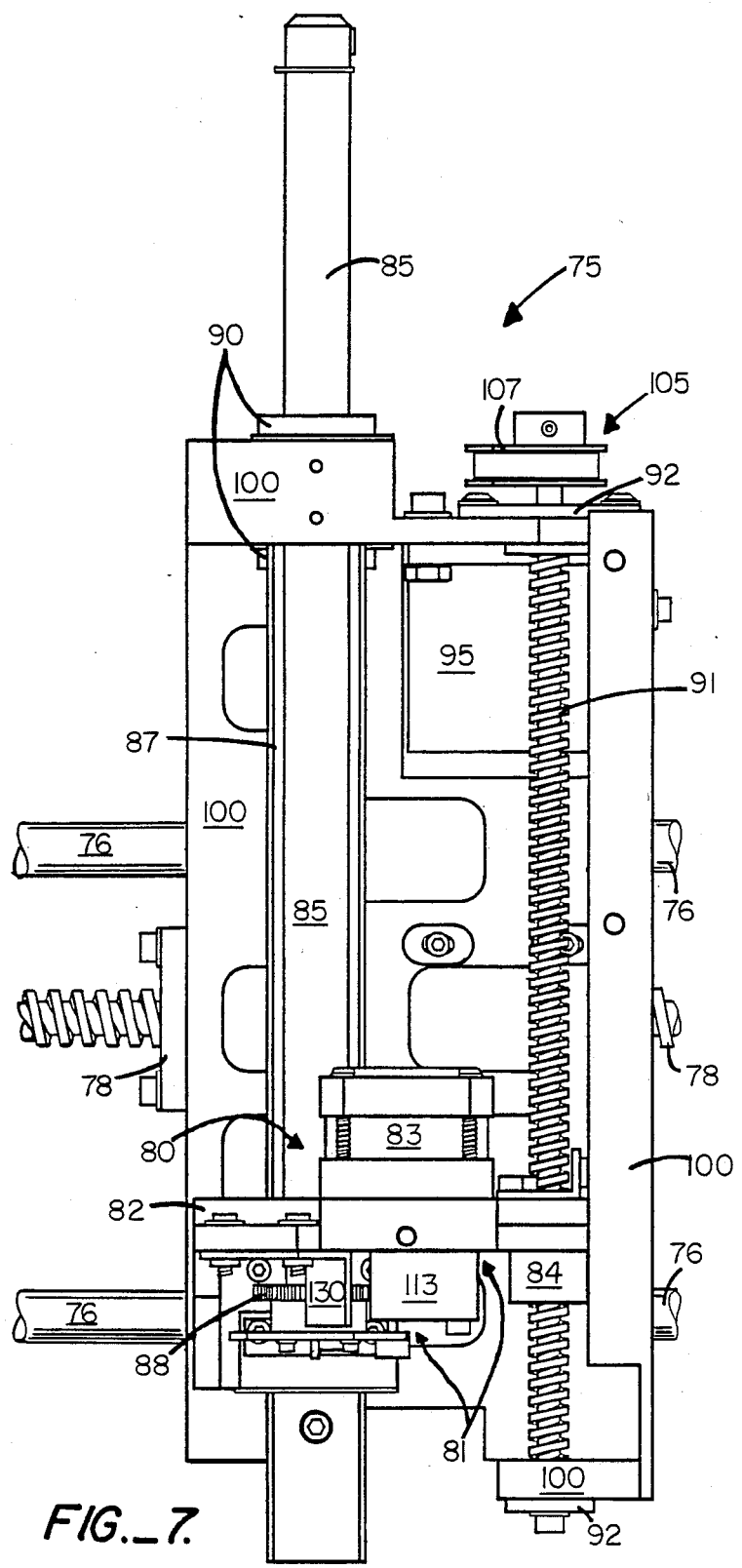
FIG._7.

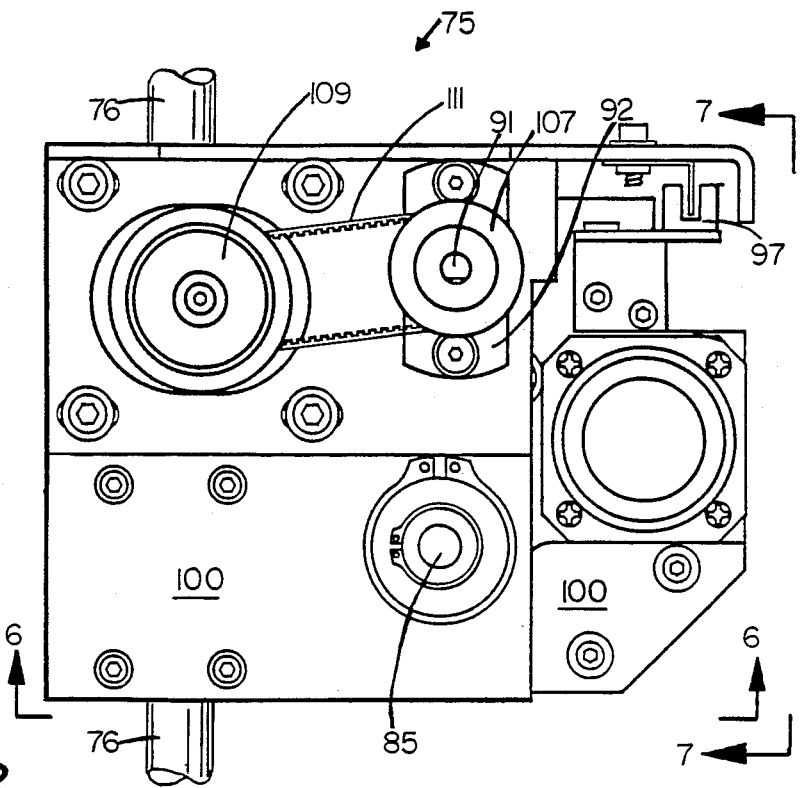
FIG._8.
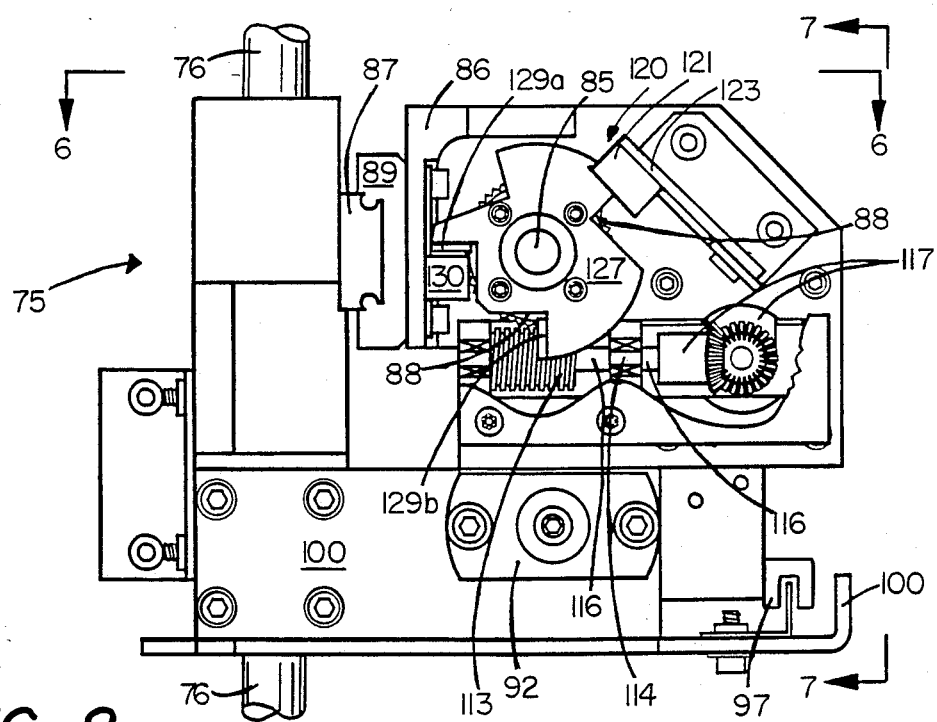
FIG._9.

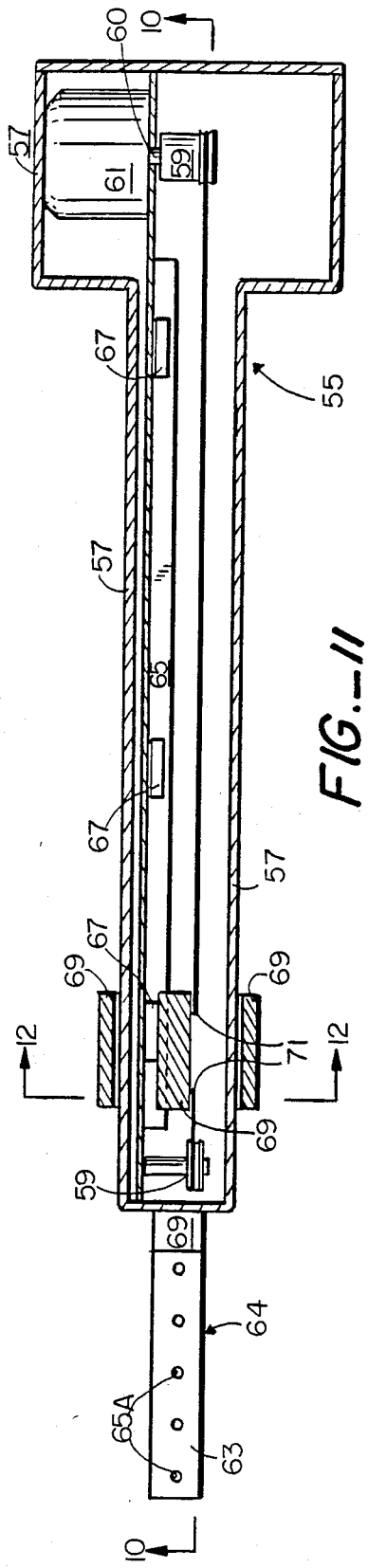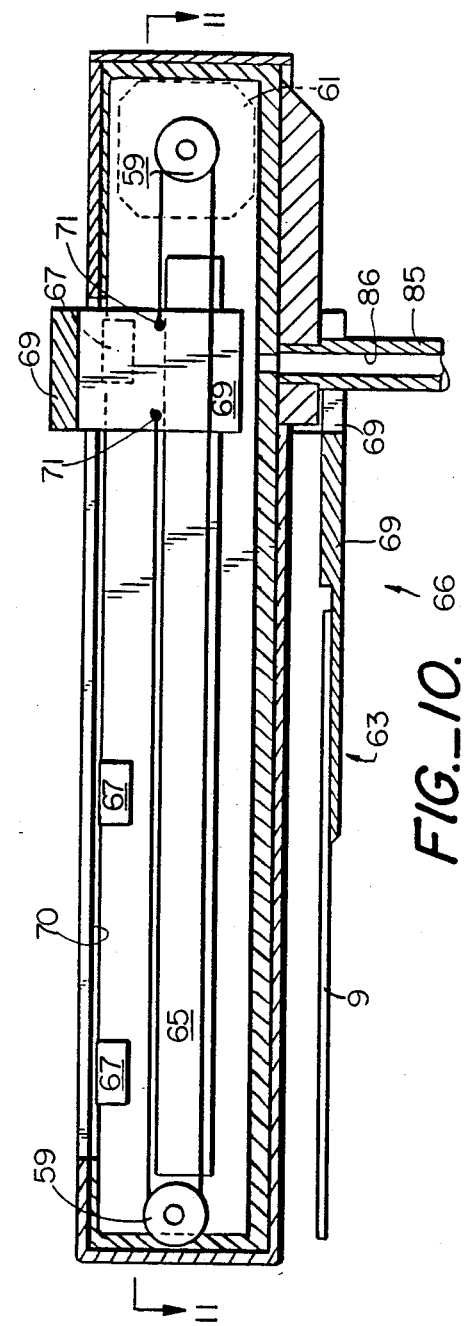

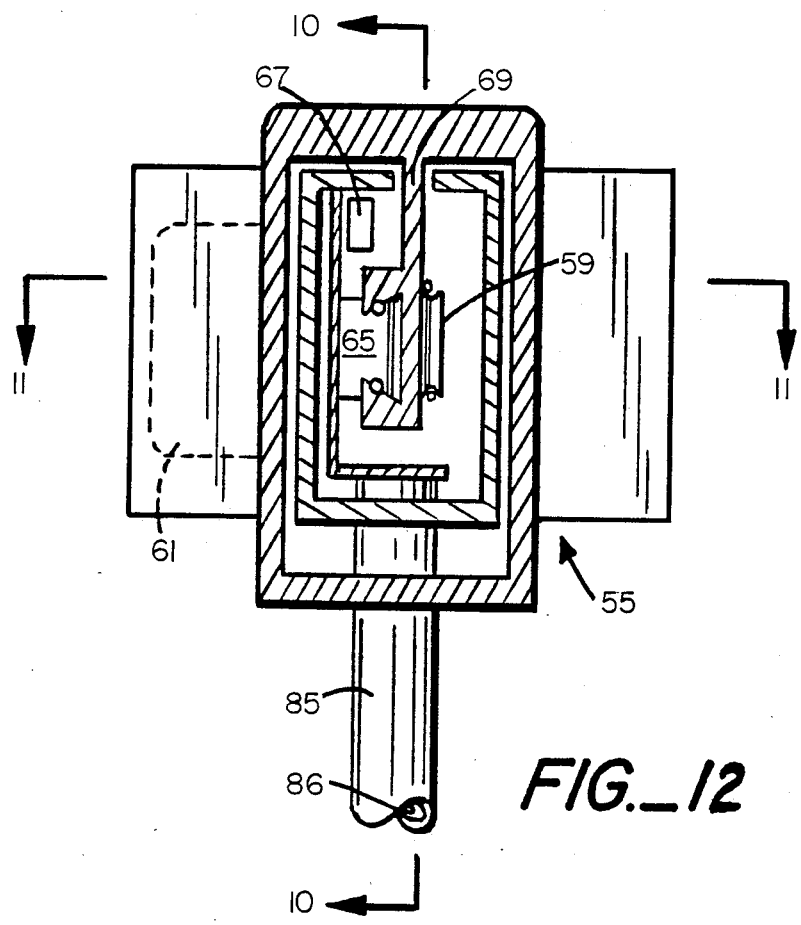
FIG._12

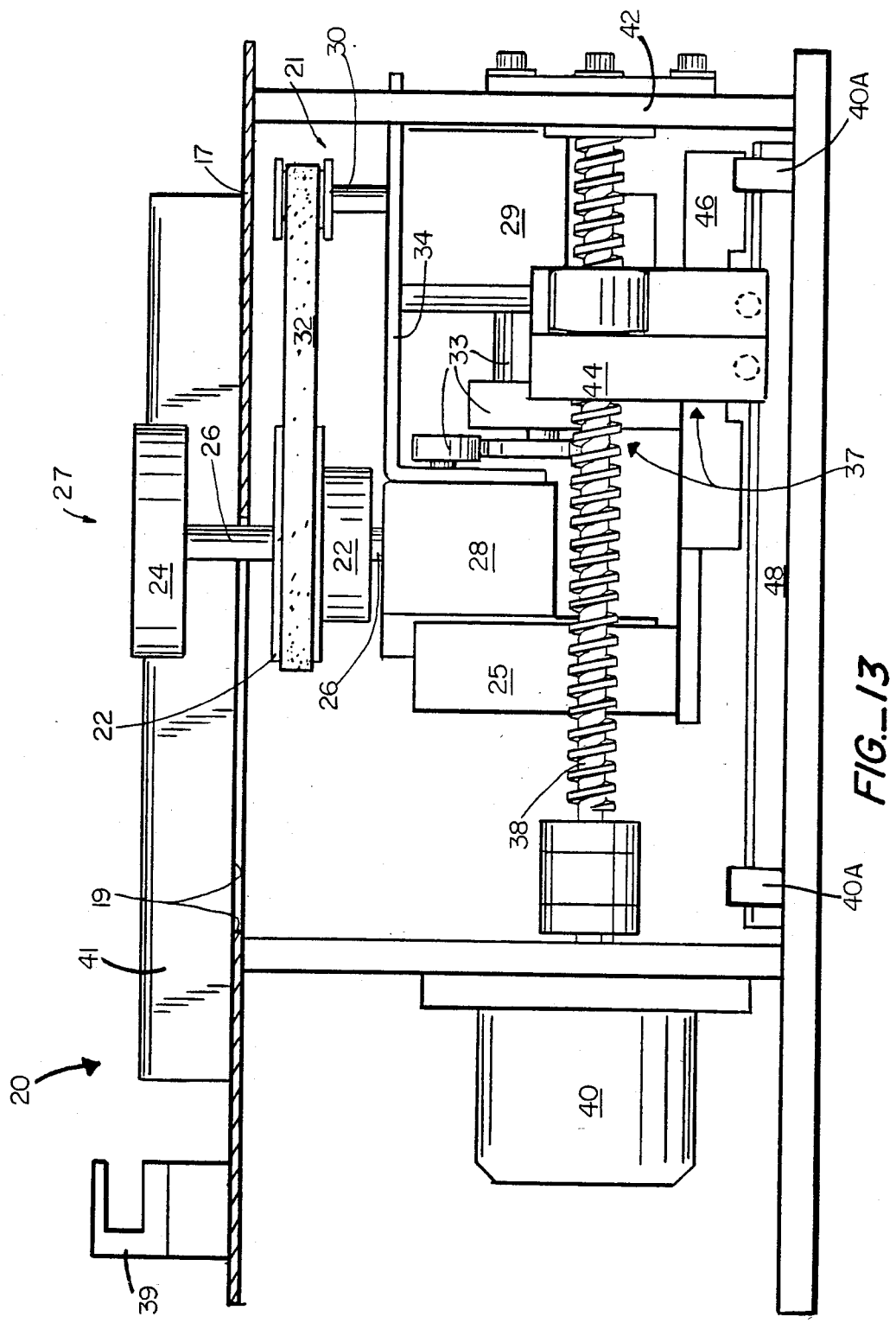
FIG._13

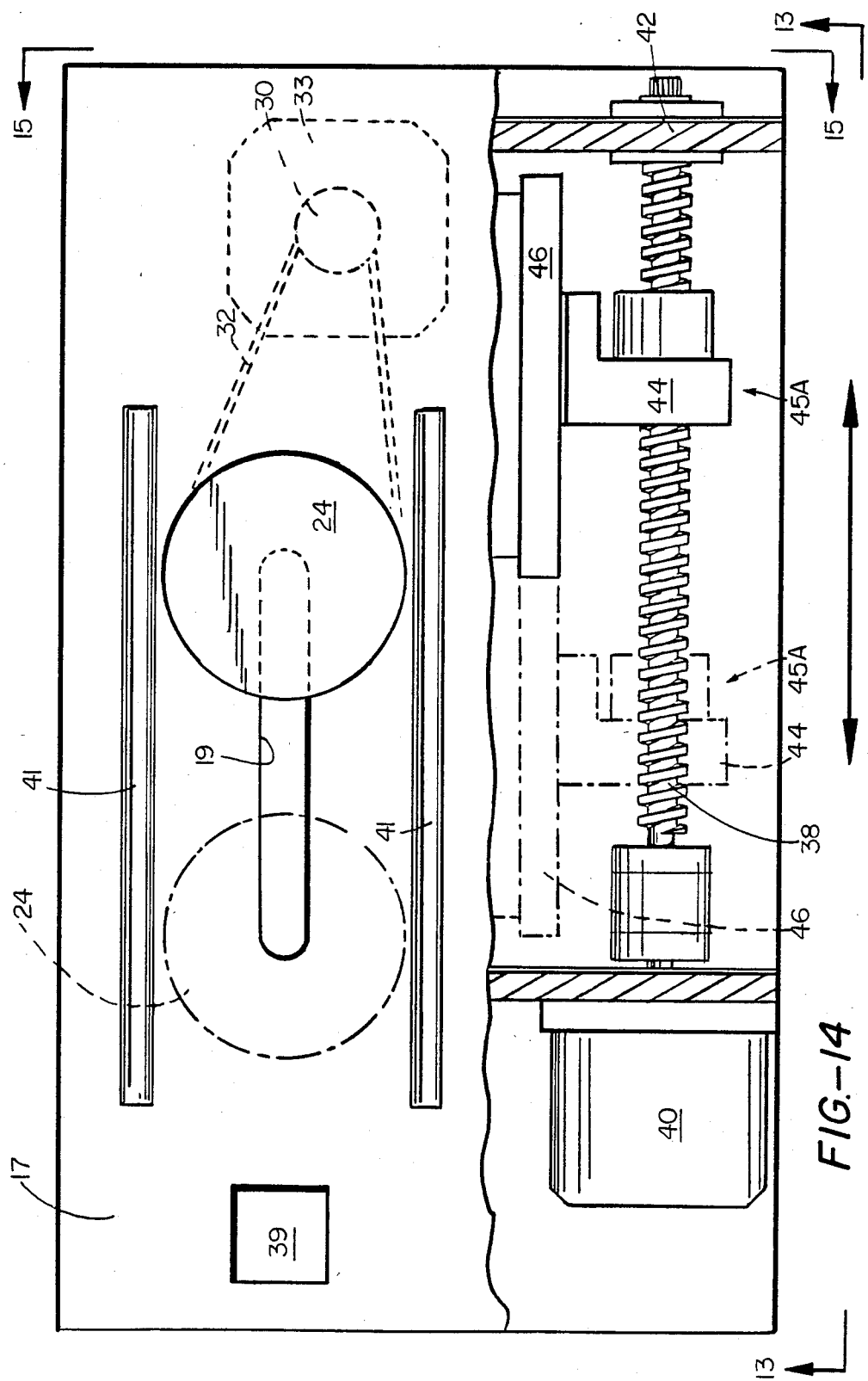

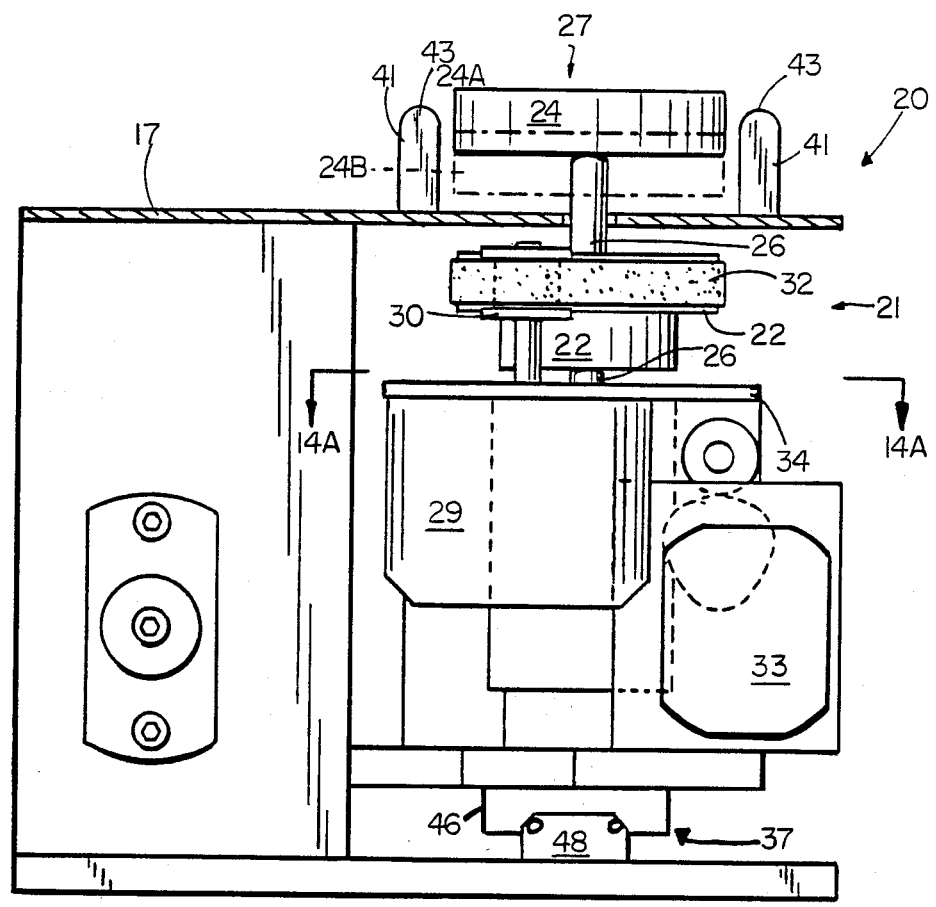
FIG._15

APPARATUS FOR HANDLING SEMICONDUCTOR WAFERS

This invention relates generally to apparatus for handling semiconductor wafers. More specifically, this invention relates to apparatus for automated handling and transfer of semiconductor wafers from wafer cassette trays to wafer testing apparatus. Such wafer testing apparatus are used to ascertain the physical and electronic characteristics of semiconductor wafers, and therefore to test the performance of semiconductor wafer manufacturing equipment employed in the process of manufacturing semiconductor devices such as, for example, large scale integrated circuits. Co-pending and commonly assigned U.S. patent application entitled "Apparatus and Methods for Semiconductor Wafer Testing", Serial No. 726,498, filed April 24, 1985, now U.S. Pat. No. 4,755,746, is an example of such testing apparatus. The specification of that application is hereby incorporated by specific reference.

Large scale integrated circuits involve the integration on a single semiconductor chip of a large number of individual semiconductor devices which are interconnected into a completed circuit. Improvements in the scale of integration of semiconductor devices on integrated circuit chips and the speed of operation of such devices have been achieved recently, resulting in substantially increased numbers of individual semiconductor devices being formed in the same area of a semiconductor chip. These improvements have been made possible by advances in integrated circuit manufacturing equipment and improvements in the materials and methods used in processing virgin semiconductor wafers into integrated circuit chips.

In general, the density of integrated circuits and their speed of operation are dependent largely upon the accuracy and resolution of the lithography and etching apparatus used to form the patterns of circuit elements on the semiconductor wafer. Density and speed are also dependent upon control of the profile of doped regions in the wafer; regions to which conductivity modifying impurities have been added. Ion implantation techniques and equipment are commonly used to achieve highly uniform doping. If the ion implantation equipment is malfunctioning such that improper or non-uniform dosages are present in the semiconductor wafer, defective integrated circuits will be produced. It has therefore become important in controlling the quality and yield of semiconductor processing to have effective in-process control monitoring and testing of the proper operation of ion implantation systems.

Resistivity mapping of test wafers has proven to be a useful process control mechanism for characterizing the accuracy and uniformity of implant dosages supplied by the ion implant apparatus. In a copending and commonly assigned patent application entitled "Apparatus and Methods for Resistivity Testing," Ser. No. 704,296, filed Feb. 22, 1985, now U.S. Pat. No. 4,703,252, a novel arrangement for performing the resistance measurements involved in resistivity testing is disclosed. The specification of that application is hereby incorporated by specific reference.

The foregoing improvements in the manufacture and testing of semiconductor wafers and integrated circuit chips have made it possible to substantially increase manufacturing capability and yield, and decrease manufacturing time. By detecting problems consistently and early, manufacturing equipment can be repaired before in-process yields are substantially reduced due to malfunctions.

Selective testing of semiconductor wafers, by resistivity testing or other means, is the method of choice in the semiconductor industry for detecting malfunctions in equipment that result in non-uniform or incorrect implant dosages. Automated wafer handling systems for loading wafers onto a wafer platform for testing are known in the art. Such handling systems are typically bulky, floor standing units. Most utilize controllers which are located external to the handling system itself and most have external wafer aligners which take up the space of a cassette tray. Additionally, many prior art wafer handling systems permit movement of the shuttle arm assembly, which picks up wafers from the cassette trays in which they are stored and transfers them to either an aligner or a testing system, only in the z and $\theta$ directions of an x, y, z, $\theta$ coordinate system. In other words, some prior art handling systems lack full translational motion capabilities; up/down movement is possible but not lateral or forward/back movement. In these systems, the cassette trays must be arranged in an arc to be accessible to the shuttle area assembly.

It is a principal object of this invention to provide an improved wafer handling apparatus for semiconductor testing systems.

It is another object of this invention to provide an improved apparatus for handling semiconductor wafers with greater ease of interfacing to automated wafer test equipment.

It is another object of this invention to provide a wafer handling apparatus for transferring semiconductor wafers from cassette trays to wafer test systems which is compact, easier for the operator to use, and more economical to manufacture.

The above-stated objects of this invention are achieved using a semiconductor wafer handling apparatus which has a platform for carrying at least one semiconductor wafer cassette tray, wafer alignment means for aligning a semiconductor wafer in a predetermined test position, and wafer transfer means for transferring the wafer between the cassette tray, the alignment means and the test system. The wafer transfer means is operational in the same plane relative to the platform and is capable of extending, retracting and rotating in that plane; it comprises a shuttle arm assembly which is mounted for translational and rotational movement so that it may be selectively aligned with the cassette tray, the alignment means and the test system, and a control means for controlling the translational and rotational movement of the shuttle arm assembly for selectively extending, retracting and rotating the shuttle arm assembly relative to the cassette tray, alignment means and test system. Accordingly, in response to signals from the control means, the shuttle arm assembly can be selectively actuated to translate to a cassette tray position and secure and remove a semiconductor wafer from the cassette tray, translate to a wafer alignment position and insert, release, secure and remove the wafer from the alignment means and rotate to a wafer test position and place the wafer on, release, secure, and lift the wafer off the test system automatically.

In addition to the shuttle arm assembly and the control means, the wafer transfer means also includes shuttle arm drive means, which moves the shuttle arm assembly in a plane perpendicular to the platform to selectively align with a wafer in the cassette tray and to place the wafer on and lift it off the test system and moves the shuttle arm assembly in a plane parallel to the platform to insert wafers into the alignment means. The shuttle arm drive means also rotates the shuttle arm assembly about an axis perpendicular to the platform to translate wafers to the wafer test position, which is about 60 degrees from the cassette tray and wafer alignment positions. Also provided are shuttle arm sensor means which sense the position of the shuttle arm assembly during the foregoing operations.

In its preferred form, the shuttle arm assembly comprises a shuttle arm housing, pulley means longitudinally disposed with the housing, a wafer shuttle motor coupled at one end of the housing to the pulley means, wafer finger means mounted on the exterior of the housing for supporting a wafer, radial slide means disposed longitudinally within the housing connected to the wafer finger means for reciprocation thereof between an extended and a retracted position in response to signals from the control means to secure and remove a wafer from the cassette tray and to insert, release, secure, and remove the wafer from the alignment system and the wafer test system. The shuttle arm sensor means is disposed to sense when the wafer finger means is in the extended or retracted position. To hold the wafer in proper position on the wafer finger means, a source of vacuum to the wafer finger means is supplied.

A shuttle arm drive assembly is provided to accomplish the foregoing operations of the shuttle arm assembly. The drive assembly in its preferred form comprises a z slide assembly mounted below the platform of the apparatus. The z slide assembly is provided with a frame, a $\theta$ motor assembly coupled to the z slide assembly and movable along the longitudinal axis of the z slide assembly within the frame in response to selective control signals from the control means to translate the shuttle arm assembly in a plane perpendicular to the platform. The $\theta$ motor assembly is coupled to the z slide assembly and movable along the longitudinal axis thereof by means of a lead screw mounted through the $\theta$ motor assembly and extending the length of the z slide.

The z slide assembly also includes a z motor assembly coupled to the shuttle arm assembly for translation of the latter in a plane perpendicular to the platform in response to selective signals from the control means. The z slide assembly additionally includes a z slide, having a length sufficient to translate the shuttle arm assembly between the uppermost slot of the cassette tray and the lower of the wafer stage of the wafer alignment means or the wafer stage of the wafer test system, a z slide "puck" or recirculating slide bearing, and a linear rotary bearing assembly coupled to the drive rod to provide translation and rotation motion of the rod in response to signals from the control means. The z slide puck is coupled between the $\theta$ motor assembly and the z slide.

The drive rod, in its preferred form is hollow and the control means, as well as the vacuum source for the apparatus, communicate with the shuttle arm assembly through the bore in the rod and therefore out of the way of the moving mechanical parts of the assembly. When the rod is translated to an upper position, the shuttle arm drive means is stabilized by the wafer finger means of the shuttle arm assembly, which weighs enough to cantilever the shuttle arm assembly, compensating for any possible instability in the drive rod and linear rotary bearing arrangement due to the smaller size of the linear rotary bearing. The entire drive assembly forms a compact, framed unit not heretofore found in the art.

The preferred form of the shuttle arm drive means also includes a lead screw disposed in opposing parallel relation to the drive rod and the z slide and extending the length thereof. The lead screw is coupled to a z motor, which is mounted within the frame of the drive means and disposed to permit unhindered movement of the $\theta$ motor throughout the length of the z slide. The z motor is connected to the lead screw by pulley means mounted at one end of the lead screw to provide rotary motion of the lead screw responsive to signals from the control means. One portion of the $\theta$ motor assembly is connected to the lead screw; a second portion is connected to the z slide assembly to form a compact, tightly designed, unit.

The aforementioned pulley means includes a first pulley mounted at one end of the lead screw, a second, substantially identically ratioed, pulley mounted on the z motor and a toothed timing belt communicating therebetween. The pulleys are disposed in a plane parallel to and beneath the platform, making the system even more compact.

The $\theta$ motor assembly comprises worm drive means connected to the shuttle arm assembly to rotate the assembly between the alignment and test positions. The worm drive means is disposed with its longitudinal axis in parallel relation to the platform; a $\theta$ motor is disposed within the frame of the assembly and is coupled to the z slide assembly for movement perpendicular to the platform. The $\theta$ motor assembly also comprises bevel gear means coupled between the worm dive means and the $\theta$ motor assembly to translate signals from the motor into rotation of the worm drive means.

The shuttle arm sensor means includes two through beam sensors, one coupled to the $\theta$ motor assembly and positioned to sense when the shuttle arm assembly is in the cassette tray position and the second coupled to the $\theta$ motor assembly and positioned to sense when the shuttle arm assembly is in the test position. A position marker means mounted on the $\theta$ motor for indicating when the shuttle arm assembly is in the cassette tray and the wafer test positions, comprising a plate mounted on the $\theta$ motor and rotatable therewith having a pair of flanged portions disposed in substantially opposed relation to each other. The $\theta$ motor assembly also includes a stop, positioned on the assembly for releasable engagement with the flanged portions of the position marker means to stop rotation of the marker means upon rotation of the shuttle arm assembly to the cassette tray and wafer test positions.

The foregoing framed unit, is coupled to the platform of the apparatus, which is formed with an orthogonal slot for accommodating translation of the shuttle arm assembly between the cassette tray position, the wafer alignment position and the wafer test position. In its preferred form that platform has dimensions enabling it to rest on a table top thus providing a compact, relatively light weight system not heretofore known in the art. The platform may form the horizontal surface of an enclosure, housing the wafer alignment means and the control means and the shuttle arm drive means of the wafer housing means As noted, the wafer alignment means is also carried by this relatively small sized platform. In its preferred form, the wafer alignment means includes wafer stage means for carrying the wafer to be aligned, wafer stage drive means coupled to the stage means for moving the stage means orthogonally to an aligned, central position beneath the major surface of the wafer, wafer support means coupled to the stage drive means for supporting the wafer above the stage means when it moves to the aligned, central position, and sensor means associated with the stage drive means for sensing when the wafer is in the aligned, central position.

The stage drive means responds to signals from the control means, to selectively translate and rotate responsive to those signals to align the wafer in the aligned, central position. The stage drive means includes a rotary drive motor, means communicating with the motor to produce rotation of the wafer stage means, a cam motor, means communicating with the cam motor to translate the wafer stage means between a stage up and a stage down position, and a recirculating bearing slide and radial lead screw assembly to translate the wafer stage means between a stage forward and a stage backward position. These translational and rotational operations of the stage drive means are all directed by the control means, after the shuttle arm assembly translates to the wafer alignment position and extends to insert a wafer into the wafer alignment means. Specifically, the wafer is deposited on the wafer stage means and the stage means is translated to a stage forward position proximate the sensor means. The sensor means then senses the distance between it and the edge of the wafer as the wafer is rotated through predetermined positions. Those distances are electronically transferred to the control means and the central, aligned position of the wafer is determined by computing the average radial position of the wafer stage means movement as known in the art. The stage drive means then lowers the stage means to the stage down position, allowing the wafer to rest on the wafer support means, and translates the stage means to the central, aligned position. The stage drive means then translates the stage means to the stage up position, lifting the wafer by its major surface in the central aligned position. Then the wafer is rotated by the stage drive means and the sensor senses the position of the wafer notch or flat. Rotation stops in a predetermined position such that all wafers will be aligned substantially identically. The wafer stage is translated to the stage backward position and the shuttle arm assembly removes the wafer from the wafer alignment means.

Preferably, the wafer support means of the assembly comprises a pair o wafer support rails mounted in opposed relation adjacent the circumference of the wafer stage means. The tops of the rails are positioned about one half the distance between the stage up and stage down positions. In addition, the wafer stage means communicates with a source of vacuum to hold the wafer on the wafer stage means during the alignment process.

The wafer handling apparatus of this invention has the advantage of compactly transferring semiconductor wafers between their storage positions in cassette trays and wafer test systems while also providing means for aligning the wafers to be tested in the same unit. As applied to handling semiconductor wafers, this capability dramatically adds to the convenience of wafer handling for the operator since the entire system is composed of a compact, relatively lightweight unit. It increases wafer test processing speeds since the control means can be conveniently programmed to direct the shuttle arm assembly to carry out operations on two wafers simultaneously. For example, the shuttle arm assembly can be directed to remove a wafer that has already been tested and return it to its slot in the cassette tray while a second wafer is being aligned in the alignment means. In this manner, the apparatus can be processing two wafers at all times.

By providing the shuttle arm drive means with a linear rotary bearing, by coupling the $\theta$ motor to the worm gear means through the bevel gear means so that the motor may be mounted parallel to the worm gear rather than abutting it, by mounting the $\theta$ motor on the z slide assembly so that when the assembly moves it carries the $\theta$ motor with it, and by arranging the z slide assembly so that minimal clearances are provided (for example, when the z slide assembly moves to access a wafer in the uppermost slot of a cassette tray, the $\theta$ motor overlaps the rotary slide bearing mounting—one tenth inch clearance is used), a much more compact arrangement of the wafer handling apparatus is achieved. This permits the packaging of all of the electronics of the assembly inside a single enclosure, with all the attendant advantages and conveniences. Signal leads are shorter, leading to greater noise immunity and connection reliability.

Economy of motion is achieved by having the wafer stage means and the shuttle arm assembly translate and rotate only a short distance. Particulate sources in the vicinity of the wafer alignment means or the wafer test system are reduced because the platform my be formed to include an enclosure and access to the shuttle arm assembly parts through the shuttle arm assembly housing is provided through an upper slot in the housing and the wafer finger means are mounted beneath the housing. Thus any particulates generated by movement of the shuttle arm assembly and the shuttle arm drive means will be contained in the assembly enclosure or the shuttle arm assembly housing and will not invade the surface of the semiconductor wafer.

Other objects, features and advantages of this invention will be apparent from a consideration of the detailed description given below in conjunction with the accompanying drawings.

FIG. 6 is a sectional view of the major components of the shuttle arm drive means of the wafer handling apparatus in accordance with this invention taken along the line 6—6 of FIG. 1.

FIG. 7 is a side view of the opposite side of the shuttle arm drive means shown in FIG. 6.

FIG. 8 is top plan view of the shuttle arm drive means in accordance with this invention.

FIG. 9 is a bottom plan view of the shuttle arm drive means in accordance with this invention.

FIG. 10 is a section view of the shuttle arm assembly taken through the line 10—10 of FIG. 1 and the line 10—10 of FIG. 12, in accordance with this invention.

FIG. 11 is a section view of the shuttle arm assembly taken through the line 11—11 of FIG. 10 and the line 11—11 of FIG. 12.

FIG. 12 is an enlarged end view of the shuttle arm assembly in section.

FIG. 13 is a side elevation view of the wafer alignment means of the invention.

FIG. 14 is a top plan view of the wafer alignment means with a portion of top cover removed.

FIG. 15 is a front elevation view thereof with the top cover portion in section.

Figure 1:
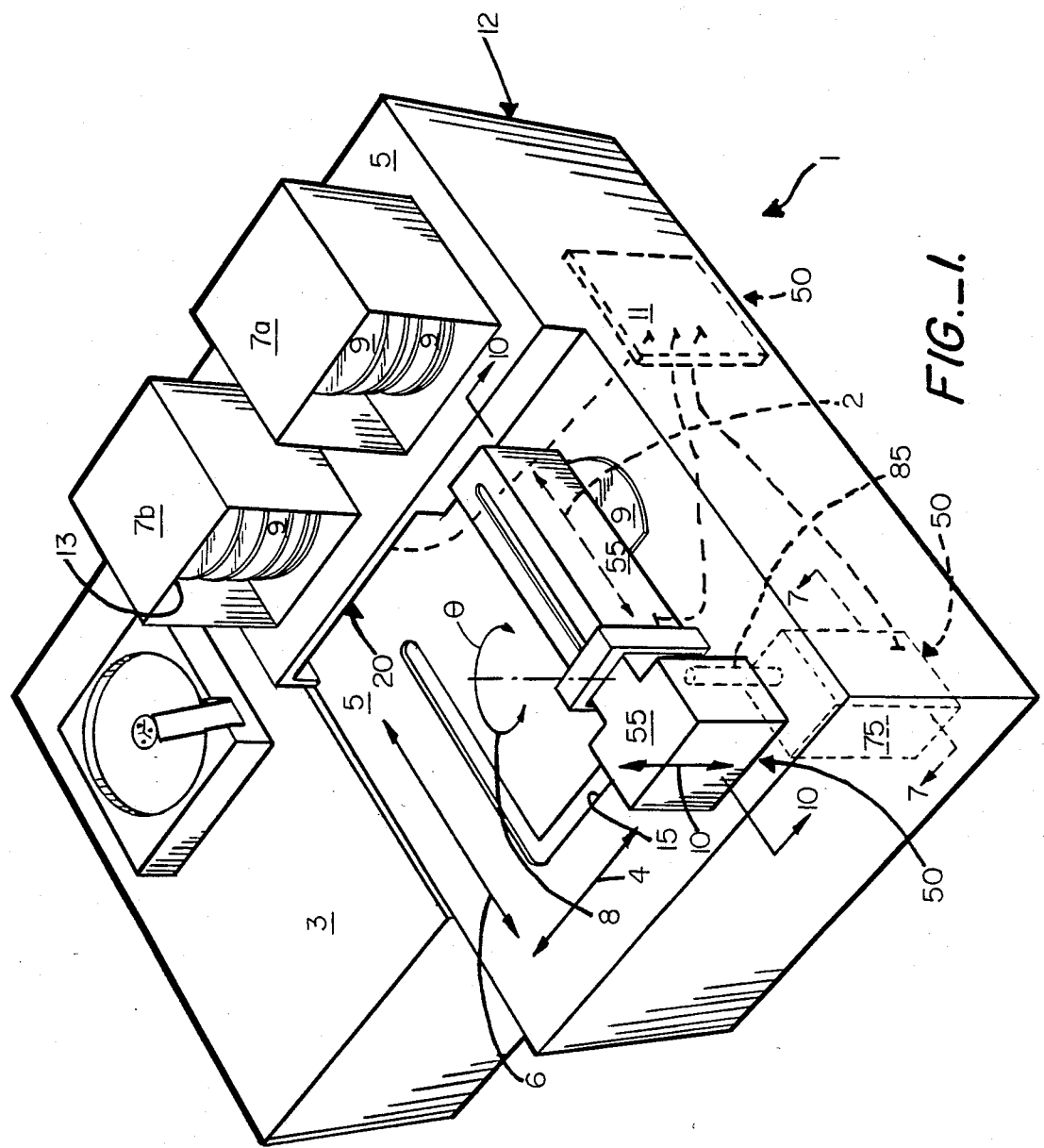
FIG. 1 is a perspective view of an automated semiconductor wafer handling apparatus in accordance with this invention, shown in its work environment in conjunction with a wafer testing system.

Referring to FIG. 1, the semiconductor wafer handling apparatus of the present invention, generally designated 1, is shown in its typical work environment, adjacent wafer test system 3. Wafer handling apparatus 1 has a platform, 5, for carrying at least one semiconductor wafer cassette tray, 7, a wafer alignment means, 20, for aligning a semiconductor wafer, 9, in its predetermined test position, and a wafer transfer means, 50, for transferring the wafer between cassette tray 7, alignment means 20 and wafer test system 3. Wafer transfer means 50 is operational in the same plane relative to the platform and is capable of extending, retracting and rotating in that plane, as shown by the arrows designated 2, 4, 6 and 8 in FIG. 1. Wafer transfer means 50 is also capable of translation in the vertical, or z direction, as also shown by an arrow 10 in FIG. 1.

Wafer transfer means 50 comprises a shuttle arm assembly, 55, which is mounted for translational and rotational movement so that it may be selectively aligned with cassette tray 7, alignment means 20 and test system 3. Wafer transfer means 50 also includes control means, 11, for controlling the translational and rotational movement of shuttle arm assembly 55 for selectively extending, retracting and rotating shuttle arm assembly 55 relative to cassette tray 7, alignment means 20 and test system 3 so that in response to signals from control means 11, shuttle arm assembly 55 can be selectively actuated to translate to a cassette tray position and secure and remove semiconductor wafer 9 from either cassette tray 7, translate to a wafer alignment position and insert, release, secure and remove wafer 9 from alignment means 20 and rotate to a wafer test position and place wafer 9 on, release, secure and lift wafer 9 off test system 3 automatically.

Figure 2:
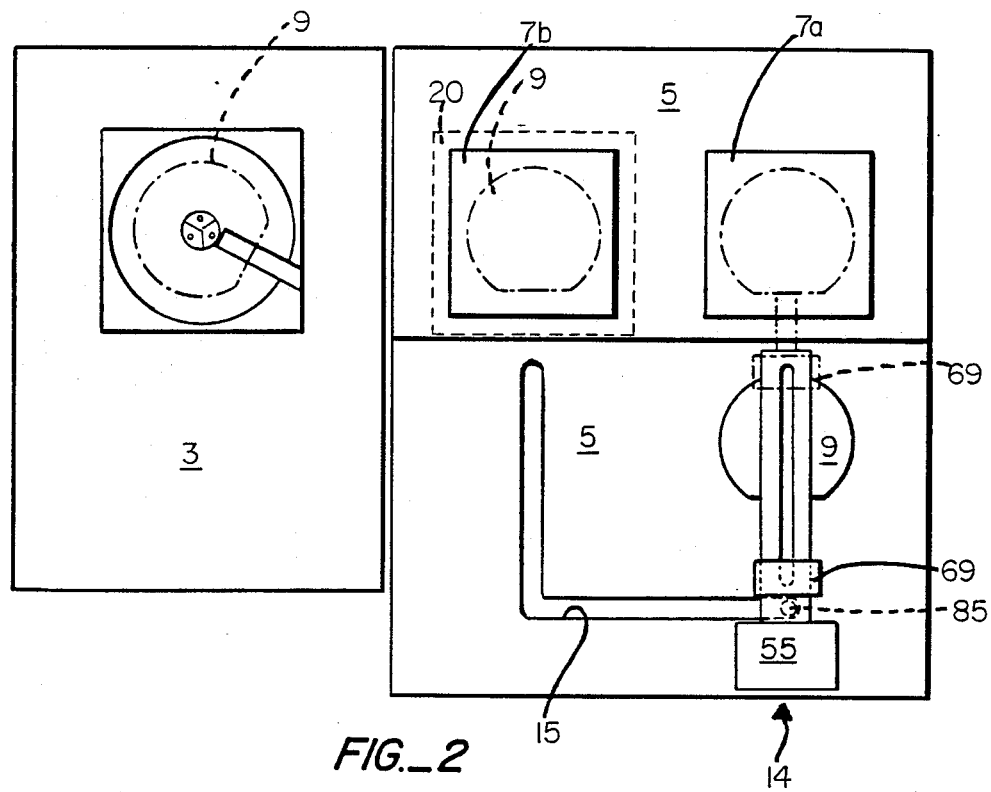
FIGS. 2, 3 and 4 are top plan views of the wafer handling apparatus in accordance with this invention, showing the movement of the shuttle arm assembly in the x, y and $\theta$ coordinates.
Figure 3:
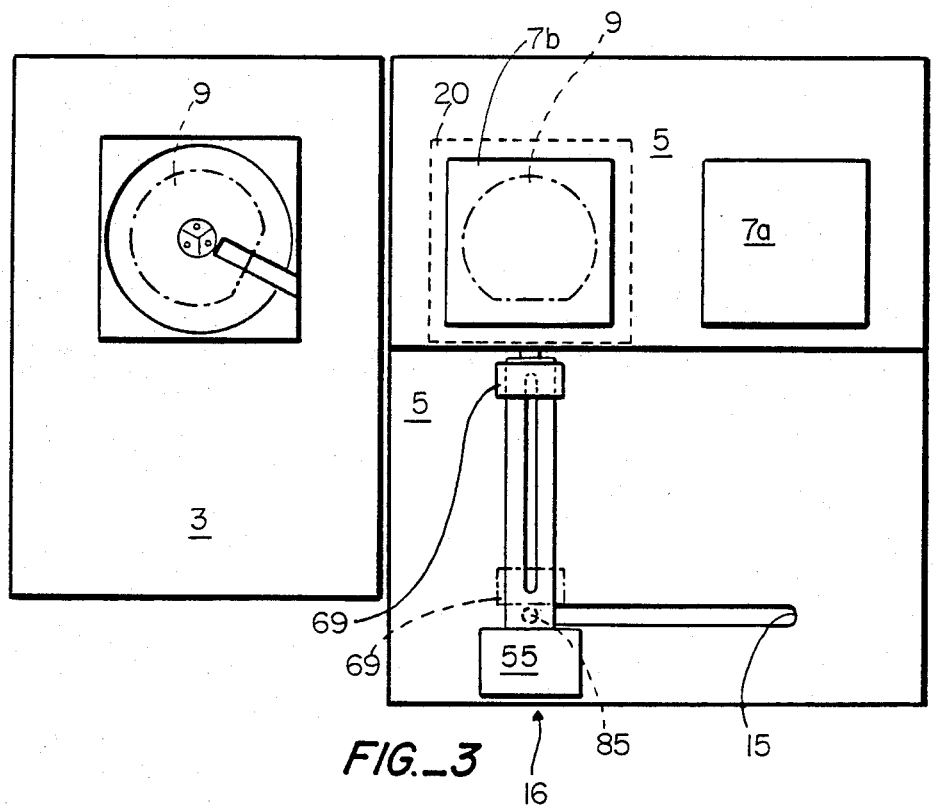
Figure 4:
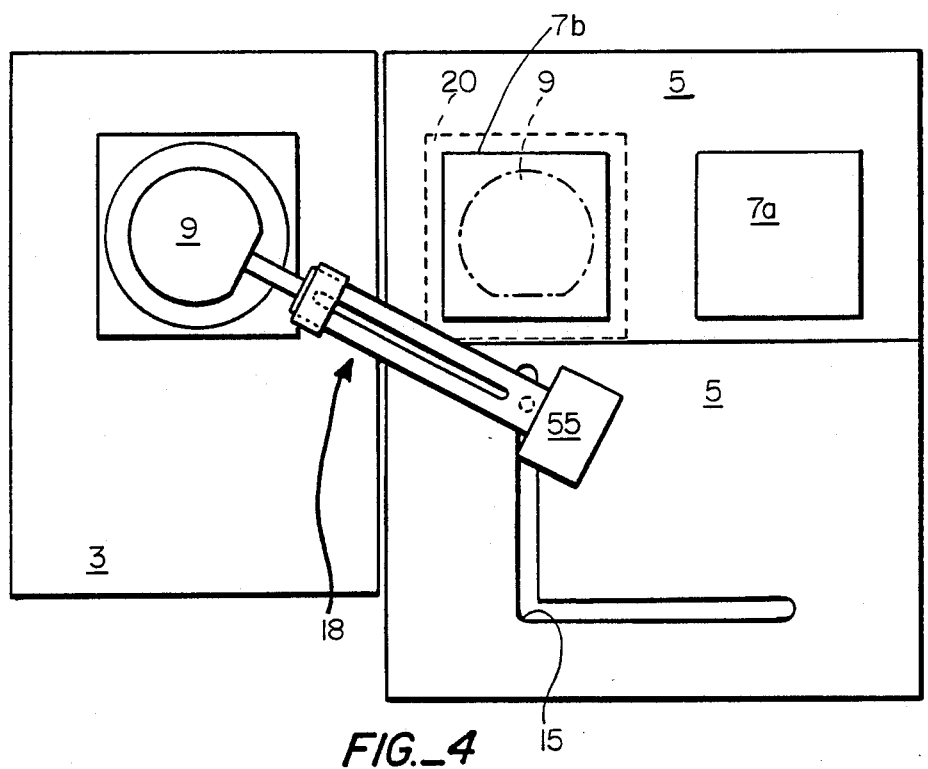

The foregoing movements of shuttle arm assembly are shown sequentially in FIGS. 2-4. In FIG. 2, two cassette trays designated 7a and 7b are shown and shuttle arm assembly 55 is shown in the cassette tray position generally designated 14, having just removed a semiconductor wafer, 9, from the right cassette tray 7a. The translation of shuttle arm assembly 55 to the cassette tray position to remove wafer 9 is shown by the phantom lines in that Figure. Control means 11, in a manner already known in the art, then directs the translation of shuttle arm assembly 55 to the wafer alignment position shown in FIG. 3 and generally designated 16. Shuttle arm assembly 55 is then extended in a manner to be described in detail below and wafer 9 is inserted into wafer alignment means 20. After alignment, wafer 9 is removed from alignment means 20 and transferred to the wafer test position shown in FIG. 4 and generally designated 18 by the translational and rotational movement of shuttle arm assembly 55 as directed by control means 11.

In addition, during the alignment of wafer 9 by alignment means 20, shuttle arm assembly 55 can be directed to translate and rotate to the wafer test position shown in FIG. 4, to pick up a wafer which has already been tested and return it to cassette tray 7. In that case, shuttle arm assembly 55 would return the wafer to the position shown in FIG. 2, insert the wafer back into the cassette tray 7, translate to the wafer alignment position 6, remove the aligned wafer and transfer it to test system 3, return to cassette tray 7 and pick up another wafer, and transfer that wafer to alignment means 20. Thus, two wafers may be processed simultaneously.

Wafer transfer means 50 also includes shuttle arm drive means 75 shown in phantom in FIG. 1 and in detail in FIG. 6-9, which moves shuttle arm assembly 55 in a plane perpendicular to the platform to selectively align with a wafer in cassette tray 7 and to place the wafer on and lift it off test system 3, moves shuttle arm assembly 55 in a plane parallel to platform 5 to insert wafers into alignment means 20, and rotates shuttle arm assembly 55 about an axis perpendicular to platform 5 to translate the wafer to the wafer test position, 18, which is about 60 degrees from the cassette tray and wafer alignment positions 14 and 16 respectively. Also provided are shuttle arm sensor means 51, 67 and 120 which sense the position of the shuttle arm assembly during the foregoing operations. Sensor means 67 is part of shuttle arm assembly 55 and sensor means 51 and 120 are parts of the shuttle arm drive means, 75. The location of sensor means 51 and 120 is best seen in FIG. 9, and the location of sensor means 67 is best seen in FIGS. 10-12.

Referring now to FIGS. 10-12, in its preferred form shuttle arm assembly 55 comprises a shuttle arm housing, 57, pulley means 59 longitudinally disposed within housing 57, a wafer shuttle motor, 61, coupled at one end of housing 57 to pulley means 59 by connecting rod 60, wafer finger means 63 for supporting a wafer mounted on the exterior of housing 57, radial slide means 65 disposed longitudinally within housing 57 connected to wafer finger means 63 for reciprocation thereof between an extended position shown generally as 64 and a retracted position shown generally as 66 in response to signals from control means 11 to secure and remove wafer 9 from cassette tray 7 and to insert, release, secure, and remove wafer 9 from alignment means 20 and wafer test system 3. Radial slide means 65 is connected to wafer finger means 63 by means of connecting assembly 69, which translates along the longitudinal axis of housing 57 and is coupled thereto both internally and externally as best seen in FIG. 12. Housing 57 is formed with a longitudinal slot 70 in its upwardly disposed surface, as shown in FIG. 10, to accommodate the internal portion of connecting assembly 69, which portion is connected to pulley means 57 by pulley pins 71. The construction of pulley means 59 is well known in art and need not be detailed herein. Shuttle arm sensor means, 67, is disposed to sense when the wafer finger means is in the extended or retracted position. To hold wafer 9 in proper position on wafer finger means 63, a source of vacuum, (not shown), to,- wafer finger means 63 is supplied through ports 65A. The mounting of pulley means 59, wafer shuttle motor 61, radial slide means 65 and sensor means 67 inside housing 57 may be accomplished by means already known in the art and need not be detailed herein.

A shuttle arm drive means, generally designated 75, shown in detail in FIGS. 6-9, is provided to accomplish the foregoing operations of shuttle arm assembly 55. The manner in which shuttle arm drive means 75 is disposed, and the manner in which its x, y translational movements are accomplished is illustrated schematically in FIG. 5. Control means 11, which can comprise a host computer, directs and controls these movements in a manner already known in the art.

Figure 5:
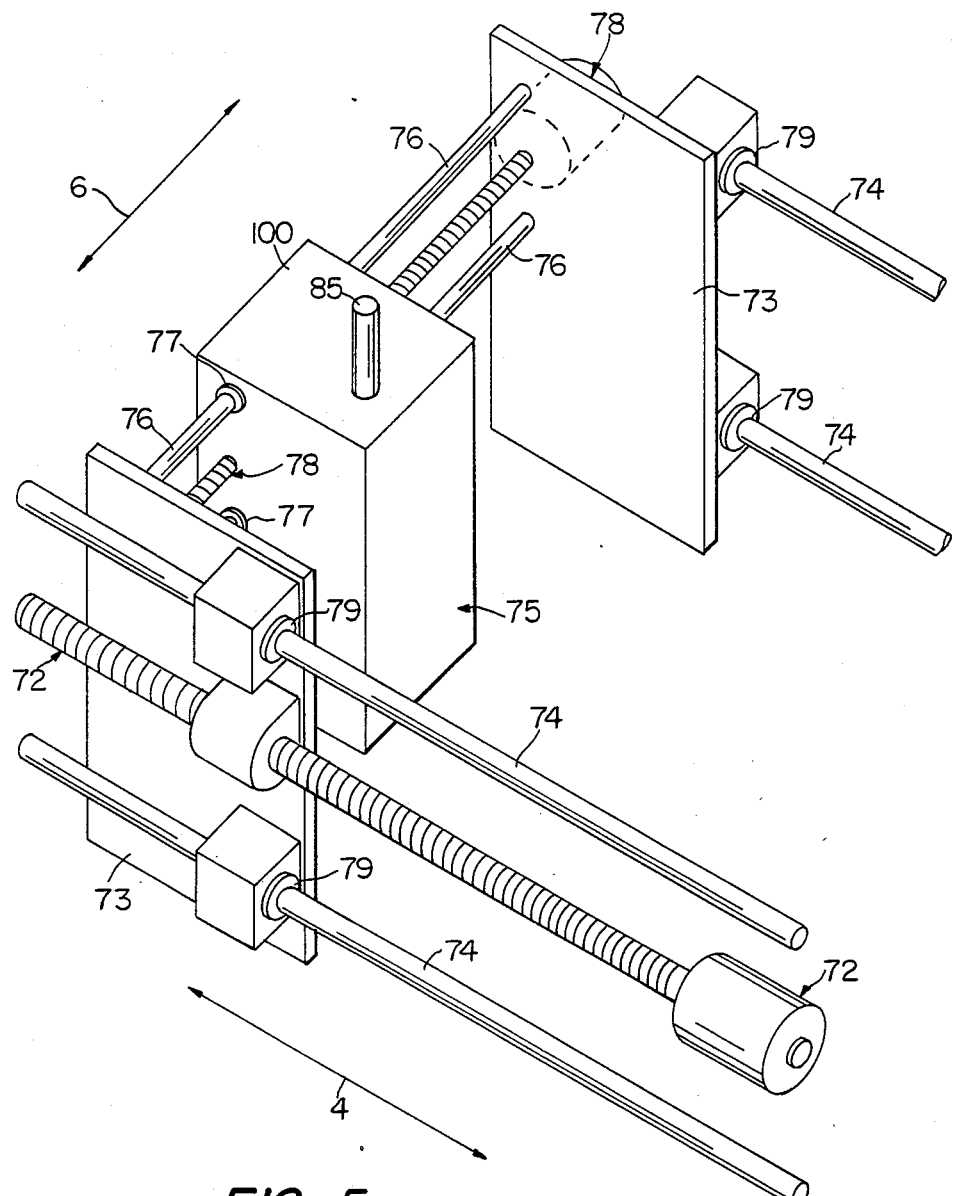
FIG. 5 is a schematic perspective view of the wafer handling apparatus in accordance with this invention, without the assembly platform or the shuttle arm assembly showing the arrangement and movement of the shuttle arm drive means.

In FIG. 5, shuttle arm drive means is shown schematically. It is mounted on mounting rods 76 through a first set of Thomson bearings 77, which permit its translation in the y direction, arrow 6 of FIG. 1, between the cassette tray and wafer alignment positions 14 and 16 shown in FIGS. 2 and 3, and the wafer test position 18 shown in FIG. 4. A front to back lead screw and motor assembly, 78, which extends through the frame, 100, of the shuttle arm drive means, accomplishes this y directional translation. See FIGS. 6–7. Mounting rods 76 and front to back lead screw assembly 78 are mounted on carriage frame 73, which is in turn connected to front and back guide rods 74 through a second set of Thomson bearings 79. Front and back guide rods 74 and second set of Thomson bearings 79 permit the translation of shuttle arm drive means 75 in the x direction, arrow 4 of FIG. 1, between cassette tray position 14 and wafer alignment position 16. A left to right lead screw and motor assembly 72, which extends in the x direction parallel to guide rods 74 and is mounted to carriage frame 73 by a lead screw nut, accomplishes the x directional translation of the shuttle arm drive means. Thus, the entire shuttle arm drive means is capable of translation in the x and y directions of an x, y, z, $\theta$ coordinate system. The z and $\theta$ directional translations, arrows 8 and 10 of FIG. 1, of the shuttle arm assembly are accomplished by the translation and rotation of the elements of the shuttle arm drive means within its frame, as will be detailed below in conjunction with FIGS. 6–9. Additionally, the shuttle arm assembly itself is capable of y directional translation, as indicated by arrow 2 of FIG. 1 and already discussed.

Referring now to FIGS. 6–9, the shuttle arm drive means, 75, in its preferred form, comprises a z slide assembly, generally designated 80, mounted below the platform, 5, of the apparatus by means of frame 100. Z slide assembly 80 is provided a $\theta$ motor assembly, generally designated 81, coupled to the z slide assembly and movable along the longitudinal axis of the z slide assembly in response to selective control signals from control means 11 for rotation of the assembly between the wafer alignment position and the wafer test position in response to selective signals from control means 11, and a z motor assembly couples to shuttle arm assembly 55 to translate the latter in a plane perpendicular to the platform. Theta motor assembly 81 is coupled to z slide assembly 80 and movable along the longitudinal axis thereof by means of a lead screw, 91, mounted through $\theta$ motor assembly 81 and extending the length of z slide assembly 80. Shuttle arm assembly 55 is mounted at the other end of drive rod 85, which extends through an orthogonal slot, 15, in platform 5. Z slide assembly 80 includes a z slide, 87, having a length sufficient to translate shuttle arm assembly 55 between the uppermost slot, 13, of cassette tray 7 and the lower of the wafer stages of wafer alignment means 20 or wafer stage of the wafer test system 3, a z slide puck or recirculating slide bearing, 89, and a linear rotary bearing assembly 90 coupled to drive rod 85 to provide translation and rotation motion of drive rod 85 in response to signals from control means 11. Z slide puck 89 is coupled between $\theta$ motor assembly 81 and z slide 87 by means of coupling member 82, as best seen in FIG. 6.

Drive rod 85, in its preferred form, is hollow and control means 11, as well as vacuum source 65, communicates with shuttle arm assembly 55 through the bore, 86, of the drive rod. This arrangement provides an added protection feature to the system not provided in wafer handling assemblies heretofore known in the art because these elements, which comprise circuit wires and vacuum tubing easily damaged, are out of the way of the moving mechanical parts of the assembly.

When drive rod 85 is translated to an upper position, shuttle arm drive means 75 is stabilized by wafer finger means 63 of shuttle arm assembly 55, which weighs enough to cantilever shuttle arm assembly 55, thereby compensating for any possible instability in the rod and linear rotary bearing arrangement due to the smaller size of linear rotary bearing 90.

Shuttle arm drive means 75 also includes a lead screw, 91, disposed in opposing parallel relation to drive rod 85 and z slide 87 and extending the length thereof. At its ends, lead screw 91 is mounted through frame 100 by means of lead screw mounting assembly 92. Lead screw 91 is coupled to a z motor, 95, which is mounted within frame 100 of shuttle arm drive means 75 and disposed to permit unhindered movement of the $\theta$ motor, 83, throughout the length of z slide 87 as best seen in FIG. 7. Z motor 95 is connected to lead screw 91 by pulley means, generally designated 105, mounted at one end of lead screw 91 to provide rotary motion of the lead screw responsive to signals from control means 11. One portion of $\theta$ motor assembly 81 is connected by lead screw nut 84 to lead screw 91; a second portion is connected to z slide assembly 80 by connecting member 86.

In the foregoing manner, the entire $\theta$ motor assembly translates along the longitudinal axis of the z slide assembly. The position of the $\theta$ motor assembly connected thereto through lead screw 91, is sensed by $\theta$ motor assembly sensor 97, which communicates with control means 11. Drive rod 85 is mounted at one end to $\theta$ motor assembly 81 at coupling member 82 by means of drive rod bearing assembly 94, as best seen in FIG. 6.

As best seen in FIG. 8, aforementioned pulley means 105 includes a first pulley 107 mounted at one end of lead screw 91, a second, substantially identically ratioed, pulley, 109, mounted on z motor 95 and a toothed timing belt 111 communicating therebetween. Pulleys 107 and 109 are disposed in a plane parallel to and beneath platform 5, as best seen in FIG. 8.

The $\theta$ motor assembly, 81, comprises worm drive means 113 connected to shuttle arm assembly 55 to rotate the assembly between the alignment and test positions. Worm drive means 113 is disposed with its longitudinal axis in parallel relation to platform 5; the $\theta$ motor, 83, is disposed within the frame, 100, of the assembly and is coupled to z slide assembly 80 for movement perpendicular to the platform. Theta motor assembly 81 also comprises bevel gear means 117 coupled through bearing assembly 114 and coupling rods 116 between worm drive means 113 and $\theta$ motor assembly 81 to translate signals from $\theta$ motor 83 into rotation of worm drive means 113. In operation, $\theta$ motor 83 drives bevel gear means 117, which rotates worm drive means 113. Worm drive means 113 is coupled to gear 88 of $\theta$ motor assembly 81 disposed in surrounding relation to drive rod 85. The rotation of worm drive means 113 causes the rotation of drive rod 85, and consequently shuttle arm assembly mounted thereto, through gear 88. Connecting θ motor 83 to worm drive means 113 through bevel gears 117, accomplishes a 90° turn in the disposition of the assembly, permitting the θ motor to be mounted within the compact space of frame 100.

The shuttle arm sensor means, 120, includes two through beam sensors, 121 and 123, one of Which, 121, is coupled to θ motor assembly 81 and positioned to sense when the shuttle arm assembly is in the cassette tray position and the second of which, 123, is coupled to a θ motor assembly 81 and positioned to sense when shuttle arm assembly 55 is in the test position. A position marker means mounted on the θ motor, 83, of θ motor assembly 81, for indicating when shuttle arm assembly 55 is in the cassette tray and the wafer test positions, comprises a plate, 127, mounted on θ motor 83 and rotatable therewith having a pair of flanged portions 129a and 129b disposed in substantially opposed relation to each other. Theta motor assembly 81 also includes a stop 130, positioned on assembly 81 for releasable engagement with the flanged portions 129 of position marker means 125 to stop rotation of the marker means upon rotation of shuttle arm assembly 55 to the cassette tray and wafer test positions.

The foregoing is mounted as illustrated in FIG. 5 to platform 5 of the apparatus, which is formed with orthogonal slot 15 for accommodating translation of shuttle arm assembly 55 between cassette tray position 14, wafer alignment position 16 and wafer test position lB. In its preferred form, platform 5 has dimensions enabling it to rest on a table top thus providing a compact, relatively light weight system not heretofore known in the art. As shown in FIG. 1, platform 5 may comprise the horizontal top surface of an enclosure, generally designated 12, formed to protect wafer alignment means 20 and shuttle arm drive means 75, which are mounted therein in the manner shown in FIG. 5 and already discussed.

As noted, wafer alignment means 20 is also carried by this relatively small sized platform. Referring to FIGS. 13-15, in its preferred form, wafer alignment means 20 includes a wafer stage means 27 for carrying the wafer to be aligned, wafer stage drive means 21 coupled to the stage means 27 for moving the stage means orthogonally to an aligned, central position beneath the major surface of the wafer, wafer support means 41 coupled to the stage drive means for supporting the wafer above the stage means when it moves to the aligned, central position, and alignment sensor means 39 associated with the stage drive means for sensing when the wafer, 9, is in an aligned, central position.

The stage drive means 21 responds to signals from control means 11, to selectively translate and rotate responsive to those signals to align wafer 9 in the aligned, central position. The stage drive means 21 includes a rotary drive motor 29, means communicating with the motor to produce rotation of the wafer stage means 27, a cam motor assembly 33, means communicating with the cam motor assembly 33 to translate the wafer stage means 27 between a stage up 24A and a sage down 248 position, and recirculating bearing slide and radial lead screw assembly 37 to translate the wafer stage means between a stage forward 45A and a stage backward 45B position. These translational and rotational operations of the stage drive means 21 are all directed by control means 11, after shuttle arm assembly 55 translates to the wafer alignment position and extends to insert a wafer into wafer alignment means 20.

The wafer is deposited on the wafer stage means 27 and the stage means is translated to a stage forward position 45A proximate the alignment sensor means 39. Alignment sensor means 39 then determines the distance between the edge of the wafer 9 and the alignment sensor 39, and senses when the wafer has been translated to the central, aligned position upon the directed translation of the stage means 24 by the control means. The central, aligned position is determined as the wafer 9 is rotated by the stage drive means 21 through central predetermined positions. Those distances are electronically transferred to the control means 11 and the central, aligned position is determined by computing the average radial position of the wafer stage as is known in the art. The stage drive means 21 then lowers the stage means 27 to the stage down position 24B allowing the wafer to rest on the wafer support means 41. The stage drive means 21 then adjusts the stage means 27 to the central aligned position. Cam motor 33 then drives the wafer stage means to the stage up position 24A to lift the wafer off the wafer support means 41 and the stage drive means 21 rotates the wafer stage means 27. Alignment sensor 39 then senses the position of the wafer notch or flat and rotation stops in a predetermined position such that all wafers will be aligned substantially identically. The wafer stage 27 is translated to the stage backward position 45B and the shuttle arm assembly 55 removes the wafer from the wafer alignment means 20.

Figure 14A:
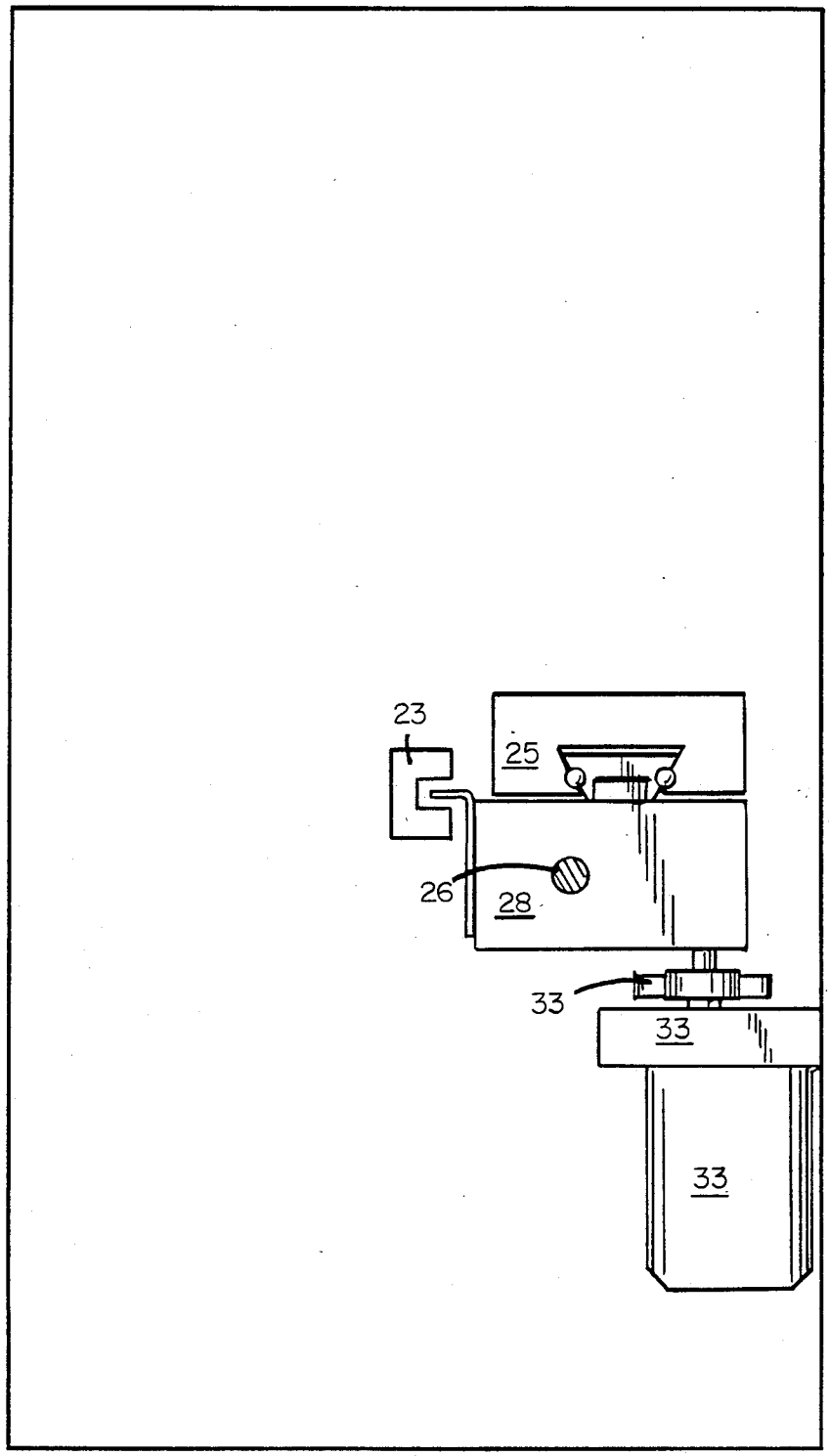
FIG. 14a is a section view of the cam motor assembly of the wafer alignment means taken generally along the line 14a-14a of FIG. 5.

In the preferred embodiment shown in FIGS. 13-15, cam motor assembly 33 translates the wafer stage means 27 between stage up 24A and stage down 24B positions and recirculating slide bearing 48 and lead screw assembly 37 translates the wafer stage means between stage forward 45A and stage backward 45B positions. Cam motor assembly 33 is mounted to alignment mounting platform 34, as best seen in FIG. 13, and is connected with alignment z slide 25 through bearings box 28 in the manner illustrated in FIG. 14a. Alignment z slide sensor 23 senses the position of wafer stage means 27 as it translates between stage up 24A and stage down 24B positions by means of cam motor assembly 33 and alignment z slide 25. The stage down position 24B is shown by phantom line 24B in FIG. 15. By means of alignment z slide 25 and z slide alignment sensor 23, which communicates with control means 11, cam motor assembly causes the translation of the wafer stage means 27.

Rotary drive motor 29 rotates the wafer stage means 27 by means of a drive belt arrangement. Drive motor 29 is formed with rotary drive rod 30 and the wafer stage means is formed with circular stage platform 22, which is connected to wafer chuck 24 by means of chuck connecting rod 26. Rotary drive belt 32 is disposed around stage platform 22 and rotary drive rod 30, such that the rotation of rotary drive 30 translates into rotation of wafer chuck 24 through stage platform 22 and chuck connecting rod 26. Bearings for chuck connecting rod 26 are contained in bearings box 28, which is mounted to alignment mounting platform 34 and disposed below stage platform 22. Drive motor 29 is connected to control means 11, which in turn is connected to θ alignment sensor 39 in the typical manner known in the art. Thus, when control means 11 directs drive motor 29 to operate, wafer chuck 24 rotates until alignment θ sensor 39 senses the flat or notch in the wafer being aligned and reports to control means 11 with an output signal that the wafer is in the aligned position and ready to be removed from the wafer alignment means by wafer transfer means 50.

Recirculating slide bearing and lead screw assembly 37, best seen in FIG. 13, operate to translate wafer stage means 27 in the horizontal plane to the stage forward position 45A shown in phantom in FIG. 14 and stage backward position 45B. The assembly includes lead screw 38 mounted between slide motor 40 and sub frame 42; antibacklash nut 44, connected to lead screw 38 and to a second mounting platform 46, which is in turn connected to wafer stage means. The assembly sits on recirculating slide bearing 48 and is connected thereto by means of mounting platform 46. Slide motor 40 is connected to and driven by control means 11 such that the horizontal translation of the wafer stage means 27 between stage forward 45A and stage backward 45B positions is accomplished. In the same manner set forth above, recirculating slide sensors 40A sense these positions. To complete the wafer alignment means assembly platform 5 includes subplatform 17 having slot 19 to permit the translation of the wafer stage means between stage forward 45A and stage backward 45B positions and to form a protective housing for the assembly.

Preferably, the wafer support means 27 of the assembly comprise a pair of wafer support rails 41 mounted in opposed relation adjacent the circumference of wafer chuck 24. As best seen in FIG. 15, the tops, 43, of the rails are positioned about one half the distance between the stage up 24A and stage down 24B positions. In addition, the wafer stage means communicates with a source of vacuum (not shown) through the bore of chuck connecting rod 26 to hold the wafer on the stage means during portions of the alignment process.

As already discussed, the wafer handling apparatus of this invention compactly transfers semiconductor wafers between their storage positions in cassette trays and wafer test systems while also providing means for aligning the wafers to be tested in the same unit. The preferred embodiment provides a relatively compact enclosure not heretofore known in the art. Since the system is packaged such that all of the electronics can fit within a single housing, it is more user friendly. The x, $\theta$ assemblies in accordance with this invention provide ease of interfacing with an automated wafer test system and the host computer can then control the overall operation of the handler and tester. ]It should be apparent to persons of ordinary skill in electromechanical system design that a number of changes could be made in the specific implementation of the features of this invention without departing from the principle and scope of the invention as claimed in the following claims.

I claim:

1. A semiconductor wafer handling apparatus for automated movement of semiconductor wafers between wafer cassette trays and wafer test systems, said assembly comprising:
   a platform for carrying at least one semiconductor wafer cassette tray;
   wafer alignment means carried by said platform for aligning a semiconductor wafer in a predetermined test position, said alignment means including:
      wafer stage means for carrying said wafer to be aligned;
      wafer stage drive means coupled to said stage means for moving said stage means orthogonally to an aligned, central position beneath the major surface of said wafer;
      wafer support means coupled to said stage drive means for supporting said wafer above said stage means when said stage means moves to said aligned, central position; and
      sensor means associated with said stage drive means for sensing when said wafer is in said aligned, central position;
   wafer transfer means associated with said platform and said wafer alignment means for transferring said wafer between said cassette tray, said alignment means and said test system;
   said wafer transfer means being operational in the same plane relative to said platform and capable of extending, retracting and rotating in said plane;
   said wafer transfer means including:
      a shuttle arm assembly mounted for translational and rotational movement so that said shuttle arm assembly may be selectively aligned with said cassette tray, said alignment means and said test system;
      means for controlling said translational and rotational movement of said shuttle arm assembly for selectively extending, retracting and rotating said shuttle arm assembly relative to each of said cassette tray, said alignment means and said test system so that in response to signals from said control means said shuttle arm assembly can be selectively actuated to translate to a cassette tray position and secure and remove a semiconductor wafer from said cassette tray, translate to a wafer alignment position and insert, release, secure and remove said wafer from said alignment means, and translate and rotate to a wafer test position and place said wafer on, release, secure, and lift said wafer off said test system.

2. The apparatus of claim 1 wherein said stage drive means is responsive to signals from said control means and is formed to selectively translate and rotate responsive to said signals to align said wafer in said aligned, central position.

3. The apparatus of claim 2 wherein said stage drive means includes a rotary drive motor, means communicating with said rotary drive motor to produce rotation of said wafer stage means, a cam motor assembly, means communicating with said cam motor assembly to translate said wafer stage means between a stage up and a stage down position, and a recirculating bearing slide and radial lead screw assembly to translate said wafer stage means between a stage forward position proximate said sensor means and a stage backward position away from said sensor means.

4. The apparatus of claim 3 wherein said sensor means is formed and positioned to sense the distance between the edge of said wafer and said sensor to sense when said wafer is in said aligned, central position upon the directed translation of said stage means by said control means, and to sense the position of the wafer notch or wafer flat of said wafer upon the control means directed rotation of said stage drive means.

5. The apparatus of claim 1 wherein said wafer stage means communicates with a source of vacuum to hold said wafer on said wafer stage means.

6. The apparatus of claim 1 wherein said wafer support means includes a pair of wafer support rails mounted in opposed relation adjacent the circumference of said wafer stage means, to tops of said rails being positioned about one half the distance between said stage up and said stage down positions.

7. A semiconductor wafer handling apparatus for automated movement of semiconductor wafers between cassette trays and wafer test systems, said assembly comprising:

a platform for carrying at least one semiconductor wafer cassette tray;

wafer alignment means carried by said platform for aligning a semiconductor wafer in a predetermined test position; and wafer transfer means associated with said platform and said wafer alignment means for transferring said wafer between said cassette tray, said alignment means and said test system;

said wafer transfer means being operational in the same plane relative to said platform and capable of extending, retracting and rotating in said plane;

said wafer transfer means being operational in the same plane relative to said platform and capable of extending, retracting and rotating in said plane;

said wafer transfer means including:

a shuttle arm assembly mounted for translational and rotational movement so that said shuttle arm assembly may be selectively aligned with said cassette tray, said alignment means and said test system;

shuttle arm drive means disposed below said platform in a compact, movable, framed unit and coupled to said shuttle arm assembly for translating said shuttle arm assembly between said cassette tray position, said wafer alignment position and said wafer test position, said shuttle arm drive means further including sensor means for sensing the position of said shuttle arm assembly, said shuttle arm drive means formed and positioned to move said shuttle arm assembly in a plane perpendicular to said platform to selectively align with a wafer in said cassette tray and to place said wafer on and lift said wafer off said test system, to move said shuttle arm assembly in a plane parallel to said platform to insert said wafer in said alignment means, and to rotate said shuttle arm assembly about an axis perpendicular to said platform to translate said wafer to said wafer test position;

said wafer transfer means also including means for controlling said translational and rotational movement of said shuttle arm assembly for selectively extending, retracting and rotating said shuttle arm assembly relative to each of said cassette tray, said alignment means and said test system so that in response to signals from said control means said shuttle arm assembly can be selectively actuated to translate to a cassette tray position and secure and remove a semiconductor wafer from said cassette tray, translate to a wafer alignment position and insert, release, secure and remove said wafer from said alignment means, and translate and rotate to a wafer test position and place said wafer on, release, secure, and lift said wafer off said test system.

8. The apparatus of claim 7 wherein said shuttle arm drive means includes a z slide assembly mounted below said platform and having a frame, a $\theta$ motor assembly coupled to said z slide assembly and movable along the longitudinal axis of said z slide assembly in response to selective control signals from said control means for rotation of said shuttle arm assembly between said wafer alignment position and said wafer test position in response to selective signals from said control means, and a z motor assembly coupled to said shuttle arm assembly to translate said shuttle arm assembly in a plane perpendicular to said platform.

9. The apparatus of claim 8 wherein said z slide assembly includes a z slide having a length sufficient to translate said shuttle arm between the uppermost slot of said cassette tray and the lower of said wafer stage means and said wafer test system, and a z slide puck, said $\theta$ motor assembly being coupled to said z slide assembly and movable along the longitudinal axis thereof by means of a lead screw mounted through said $\theta$ motor assembly and extending said length of said z slide, said z slide puck being coupled therebetween.

10. The apparatus of claim 9 further including a lead screw disposed in opposing parallel relation to said drive rod and said z slide and extending said length thereof, said lead screw being coupled to a z motor, said z motor being mounted within said frame of said shuttle arm drive means and disposed to permit unhindered movement of said $\theta$ motor throughout said length of said z slide, said z motor connected to said lead screw by pulley means mounted at one end of said lead screw to provide rotary motion of said lead screw responsive to signals from said control means.

11. The apparatus of claim 10 wherein one portion of said $\theta$ motor assembly is connected to said lead screw and a second portion of said $\theta$ motor assembly is connected to said z slide assembly.

12. The apparatus of claim 11 wherein said pulley means includes a first pulley mounted at one end of said lead screw, a second, substantially identically ratioed, pulley mounted on said z motor, said first and second pulleys being disposed in a plane parallel to and beneath said platform, and a toothed timing belt communicating therebetween.

13. The apparatus of claim 8 wherein said $\theta$ motor assembly includes worm drive means connected to said shuttle arm assembly to rotate said shuttle arm assembly between said wafer alignment position and said wafer test position and having its longitudinal axis disposed in parallel relation to said platform, a $\theta$ motor disposed within said frame and coupled to said z slide assembly for movement along an axis perpendicular to said platform, bevel gear means coupled between said worm drive means and said $\theta$ motor to translate signals from said motor into rotation of said worm drive means.

14. The apparatus of claim 9 further including a linear rotary bearing assembly coupled to said drive rod to provide translation and rotation motion of said rod in response to signals from said control means.

15. The apparatus of claim 14 wherein said rod is hollow and said control means and said vacuum source communicate with said shuttle arm assembly through the bore in said drive rod.

16. A semiconductor wafer handling apparatus for automated movement of semiconductor wafers between wafer cassette trays and wafer test systems, said assembly comprising:

a platform for carrying at least one semiconductor wafer cassette tray;

wafer alignment means carried by said platform for aligning a semiconductor wafer in a predetermined test position; and wafer transfer means associated with said platform and said wafer alignment means for transferring said wafer between said cassette tray, said alignment means and said test system;
said wafer transfer means being operational in the same plane relative to said platform and capable of extending, retracting and rotating in said plane; said wafer transfer means including;
a shuttle arm assembly mounted for translational and rotational movement so that said shuttle arm assembly may be selectively aligned with said cassette tray, said alignment means and said test system;
shuttle arm drive means disposed below said platform in a compact, movable, framed unit and coupled to said shuttle arm assembly for translating said shuttle arm assembly between said cassette tray position, said wafer alignment position and said wafer test position,
said shuttle arm drive means further including sensor means for sensing the position of said shuttle arm assembly, said shuttle arm sensor means including a first through beam sensor coupled to said θ motor assembly and positioned to sense when said shuttle arm assembly is in said cassette tray position, said second through beam sensor coupled to said θ motor assembly and positioned to sense when said shuttle arm assembly is in said wafer test position, and a position marker means mounted on said θ motor for indicating when said shuttle arm assembly arm assembly is in said cassette tray and said wafer test positions;
said wafer transfer means also including means for controlling said translational and rotational movement of said shuttle arm assembly for selectively extending, retracting and rotating said shuttle arm assembly relative to each of said cassette tray, said alignment means and said test system so that in response to signals from said control means said shuttle arm assembly can be selectively actuated to translate to a cassette tray position and secure and remove a semiconductor wafer from said cassette tray, translate to a wafer alignment position and insert, release, secure and remove said wafer from said alignment means, and translate and rotate to a wafer test position and place said wafer on, release, secure, and lift said wafer off said test system.

17. The apparatus of claim 16 wherein said position marker means includes a plate mounted on said motor for rotation therewith, said plate having a pair of flanged portions disposed in substantially opposed relation to each other and said θ motor assembly includes a stop positioned on said θ motor assembly for releasable engagement with said flanged portions of said position marker means to stop rotation of said marker means upon rotation of said shuttle arm assembly to said cassette tray and said wafer test positions.

18. A semiconductor wafer handling apparatus for automated movement of semiconductor wafers between wafer cassette trays and wafer test systems, said assembly comprising:
a platform for carrying at least one semiconductor wafer cassette tray, said platform including an orthogonal slot for accommodating translation of said shuttle arm assembly between said cassette tray position, said wafer alignment position and said wafer test position and said wafer test position is about 60 degrees from said cassette tray position and said wafer alignment position;
wafer alignment means carried by said platform for aligning a semiconductor wafer in a predetermined test position; and
wafer transfer means associated with said platform and said wafer alignment means for transferring said wafer between said cassette tray, said alignment means and said test systems;
said wafer transfer means being operational in the same plane relative to said platform and capable of extending, retracting and rotating in said plane;
said wafer transfer means including:
a shuttle arm assembly mounted for translational and rotational movement so that said shuttle arm assembly may be selectively aligned with said cassette tray, said alignment means and said test system;
shuttle arm drive means disposed below said platform in a compact, movable, framed unit and coupled to said shuttle arm assembly for translating said shuttle arm assembly between said cassette tray position, said wafer alignment position and said wafer test position,
said shuttle arm drive means further including sensor means for sensing the position of said shuttle arm assembly;
said wafer transfer means also including means for controlling said translational and rotational movement of said shuttle arm assembly for selectively extending, retracting and rotating said shuttle arm assembly relative to each of said cassette tray, said alignment means and said test system so that in response to signals from said control means said shuttle arm assembly can be selectively actuated to translate to a cassette tray position and secure and remove a semiconductor wafer from said cassette tray, translate to a wafer alignment position and insert, release, secure and remove said wafer from said alignment means, and translate and rotate to a wafer test position and place said wafer on, release, secure, and lift said wafer off said test system.

19. A semiconductor wafer handling apparatus; for automated movement of semiconductor wafers between wafer cassette trays and wafer test systems, said assembly comprising:
a platform for carrying at least one semiconductor wafer cassette tray;
wafer alignment means carried by said platform for aligning a semiconductor wafer in a predetermined test position; and
wafer transfer means associated with said platform and said wafer alignment means for transferring said wafer between said cassette tray, said alignment means and said test system;
said wafer transfer means being operational in the same plane relative to said platform and capable of
extending, retracting and rotating in said plane; said wafer transfer means including:

a shuttle arm assembly mounted for translational and rotational movement so that said shuttle arm assembly may be selectively aligned with said cassette tray, said alignment means and said test system;

said shuttle arm assembly including a shuttle arm housing, pulley means longitudinally disposed within said housing, a wafer shuttle motor coupled at one end of said housing to said pulley means, wafer finger means for supporting said wafer mounted on the exterior of said housing, radial slide means disposed longitudinally within said housing connected to said wafer finger means for reciprocation thereof between an extended and a retracted position in response to signals from said control means to secure and remove said wafer from said cassette tray, and to insert, release, secure and remove said wafer from said alignment means and said wafer test system, said shuttle arm sensor means being disposed and arranged to sense when said wafer finger means is in said extended or in said retracted position;

shuttle arm drive means disposed below said platform in a compact, movable, framed unit and coupled to said shuttle arm assembly for translating said shuttle arm assembly between said cassette tray position, said wafer alignment position and said wafer test position, said shuttle arm drive means further including sensor means for sensing the position of said shuttle arm assembly, said wafer transfer means also including means for controlling said translational and rotational movement of said shuttle arm assembly for selectively extending, retracting and rotating said shuttle arm assembly relative to each of said cassette tray, said alignment means and said test system so that in response to signals from said control means said shuttle arm assembly can be selectively actuated to translate to a cassette tray position and secure and remove a semiconductor wafer from said cassette tray, translate to a wafer alignment position and insert, release, secure and remove said wafer from said alignment means, and translate and rotate to a wafer test position and place said wafer on, release, secure, and lift said wafer off said test system.

20. The apparatus of claim 19 wherein said wafer finger means communicates with said source of vacuum to hold said wafer on said finger means.

21. The apparatus of claim 20 wherein said housing is formed with an upwardly disposed longitudinal slot and said wafer finger means is mounted proximate said housing exterior opposing said slot.

22. A semiconductor wafer handling apparatus for automated movement of semiconductor wafers between wafer cassette trays and wafer test systems comprising an orthogonally slotted platform for carrying at least one semiconductor wafer cassette tray, control means, wafer alignment means carried by said platform for aligning a semiconductor wafer in a predetermined test position and wafer transfer means mounted below said platform and extending through said slot, said wafer transfer means comprising a shuttle arm assembly mounted for translational and rotational movement so that said shuttle arm assembly may be selectively aligned with said cassette tray, said alignment means and said test system and further comprising means for controlling said translational and rotational movement of said shuttle arm assembly selectively for translational to a cassette tray position to secure and remove a semiconductor wafer from said cassette tray, translation to a wafer alignment position to insert, release, secure and remove said wafer from said alignment means, and translation and rotation to a wafer test position to place said wafer on, release, secure, and lift said wafer off said test system, said wafer transfer means further including shuttle arm drive means disposed below said platform in a compact, movable, framed unit and coupled to said shuttle arm assembly for translating said shuttle arm assembly between said cassette tray position, said wafer alignment position and said wafer test position, and shuttle arm sensor means associated with said shuttle arm drive means for sensing the position of said shuttle arm assembly, said shuttle arm drive means including a z slide assembly mounted below said platform and having a frame, a $\theta$ motor assembly coupled to said z slide assembly and movable along the longitudinal axis of said z slide assembly in response to selective control signals from said control means to translate said shuttle arm assembly in a plane perpendicular to said platform, and a z motor assembly coupled to said shuttle arm assembly for rotation of said shuttle arm assembly between said wafer alignment position and said wafer test position in response to selectively signals from said control means, said z motor assembly including a z slide having a length sufficient to translate said shuttle arm assembly between the uppermost slot of said cassette tray, said wafer alignment means, and said wafer test system, and a z slide puck, and $\theta$ motor assembly being coupled to said z slide assembly and movable along the longitudinal axis thereof by means of a driven rod mounted at one end to said $\theta$ motor assembly and extending said length of said z slide, said z slide puck being coupled therebetween, said shuttle arm assembly further including a linear rotary bearing assembly coupled with said drive rod to provide translation and rotation motion of said drive rod in response to signals from said control means.

23. The apparatus of claim 22 wherein said platform forms the top portion of an enclosure, said enclosure containing said wafer alignment means and said wafer transfer means, said shuttle arm assembly rod extending vertically through said enclosure.

24. The apparatus of claim 23 wherein said z slide assembly further includes a lead screw disposed in opposing parallel relation to said drive rod and said z slide and extending said length thereof, said lead screw being coupled to a z motor, said z motor being mounted within said frame of said shuttle arm drive means and disposed to permit unhindered movement of said $\theta$ motor throughout said length of said z slide, said z motor connected to said lead screw by pulley means mounted at one end of said lead screw to provide rotary motion of said lead screw responsive to signals from said control means.

25. The apparatus of claim 24 wherein one portion of said $\theta$ motor assembly is connected to said lead screw and a second portion of said $\theta$ motor assembly is connected to said z slide assembly.

26. The apparatus of claim 25 further including pulley means comprising a first pulley mounted at one end of said lead screw, a second, substantially identically ratioed, pulley mounted on said z motor, said first and second pulleys being disposed in a plane parallel to and beneath said platform, and a toothed timing belt communicating therebetween.

27. The apparatus of claim 22 wherein said θ motor assembly includes worm drive means connected to said shuttle arm assembly to rotate said shuttle arm assembly between said wafer alignment position and said wafer test position and having its longitudinal axis disposed in parallel relation to said platform, a θ motor disposed within said frame and coupled to said z slide assembly for movement along an axis perpendicular to said platform, bevel gear means coupled between said worm drive means and said θ motor to translate signals from said motor into rotation of said worm drive means.

28. The apparatus of claim 22 wherein said shuttle arm sensor means includes a first through beam sensor coupled to said θ motor assembly and positioned to sense when said shuttle arm assembly is in said cassette tray position, a second through beam sensor coupled to said θ motor assembly and positioned to sense when said shuttle arm assembly is in said wafer test position, and a position marker means mounted on said θ motor assembly for indicating when said shuttle arm assembly is in said cassette tray and said wafer test positions, said position marker means including a plate mounted on said motor for rotation therewith, said plate having a pair of flanged portions disposed in substantially opposed relation to each other and said θ motor assembly includes a stop positioned on said θ motor assembly for releasable engagement with said flanged portions of said position marker means to stop rotation of said marker means upon rotation of said shuttle arm assembly to said cassette tray and said wafer test positions.

29. The apparatus of claim 28 wherein said shuttle arm assembly includes a shuttle arm housing, pulley means longitudinally disposed within said housing, a wafer shuttle motor coupled at one of end said housing to said pulley means, wafer finger means for supporting said wafer mounted on the exterior of said housing and communicating with a source of vacuum for holding said wafer, radial slide means disposed longitudinally within said housing connected to said wafer finger means for reciprocation thereof between an extended and a retracted position in response to signals from said control means to secure and remove said wafer from said cassette tray, and to insert, release, secure and remove said wafer from said alignment means and said wafer test system, said shuttle arm sensor means being disposed and arranged to sense when said wafer finger means is in said extended or in said retracted position.

30. The apparatus of claim 22 wherein said alignment means includes wafer stage means for carrying said wafer to be aligned, wafer stage drive means coupled to said stage means for moving said stage means orthogonally to an aligned, central position beneath the major surface of said wafer, wafer support means coupled to said drive means for supporting said wafer above said stage means when said stage means moves to said aligned, central position, and sensor means associated with said stage drive means for sensing when said wafer is in said aligned, central position said stage drive means being responsive to signals from said control means and formed to selectively translate and rotate responsive to said signals to align said wafer in said aligned, central position including a rotary drive motor, means communicating with said rotary drive motor to produce rotation of said wafer stage means, a cam motor assembly, means communicating with said cam motor assembly to translate said wafer stage means between a stage up and a stage down position, and a recirculating slide and radial lead screw assembly to translate said wafer stage means between a stage forward and a stage backward position, said wafer stage means communicating with a source of vacuum to hold said wafer on said wafer stage means and said wafer support means including a pair of wafer support rails mounted in opposed relation adjacent the circumference of said wafer stage means.

31. A shuttle arm drive assembly for an automated semiconductor wafer handling apparatus having a platform for carrying at least one semiconductor wafer cassette tray, control means, wafer alignment means carried by said platform for aligning a semiconductor wafer in a predetermined test position, wafer test means for testing a semiconductor wafer, and wafer transfer means associated with said platform and said wafer alignment means for transferring said wafer between said cassette tray, said alignment means and said test system, said shuttle arm drive assembly comprising:

a z slide assembly mounted below said platform and having a frame, said z slide assembly including a z slide having a length sufficient to translate said shuttle arm between the uppermost slot of said cassette tray, said wafer alignment means, and said wafer test system;

a z slide puck, said θ motor assembly being coupled to said z slide assembly and movable along the longitudinal axis thereof by means of a lead screw mounted through said θ motor assembly and extending said length of said z slide, said z slide puck being coupled therebetween;

a drive rod disposed in opposing parallel relation to said lead screw and said z slide and extending said length thereof, said lead screw being coupled to a z motor, said z motor being mounted within said frame of said shuttle arm drive means and disposed to permit unhindered movement of said θ motor throughout said length of said z slide, said z motor connected to said lead screw by pulley means mounted at one end of said lead screw to provide rotary motion of said lead screw responsive to signals from said control means, one portion of said θ motor assembly is connected to said lead screw and a second portion of said θ motor assembly is connected to said z slide assembly, said pulley means including a first pulley mounted at one end of said lead screw, a second, substantially identically ratioed, pulley mounted on said z motor, said first and second pulleys being disposed in a plane parallel to and beneath said platform, and a toothed timing belt communicating therebetween;

a θ motor assembly coupled to said z slide assembly disposed within said frame and movable along the longitudinal axis of said z slide assembly in response to selective control signals from said control means, for rotation of said shuttle arm between said wafer alignment position and said wafer test position in response to selective signals from said control means and a z motor assembly coupled to said shuttle arm to translate said shuttle arm in a plane perpendicular to said platform.

32. A shuttle arm drive assembly for an automated semiconductor wafer handling apparatus having a platform for carrying at least one semiconductor wafer cassette tray, control means, wafer alignment means carried by said platform for aligning a semiconductor wafer in a predetermined test position, wafer test means for testing a semiconductor wafer, and wafer transfer means associated with said platform and said wafer alignment means for transferring said wafer between said cassette tray, said alignment means and said test system, said shuttle arm drive assembly comprising:

a z slide assembly mounted below said platform and having a frame,
said z slide assembly including
a z slide having a length sufficient to translate said shuttle arm between the uppermost slot of said cassette tray, said wafer alignment means, and said wafer test system;
a z slide puck, said θ motor assembly being coupled to said z therebetween;
a drive rod disposed in opposing parallel relation to said lead screw on said z slide and extending said length thereof, said lead screw being coupled to a z motor, said z motor being mounted within said frame of said shuttle arm drive means and disposed to permit unhindered movement of said θ motor throughout said length of said z slide, said z motor connected to said lead screw by pulley means mounted at one end of said lead screw to provide rotary motion of said lead screw responsive to signals from said control means,
wherein said drive rod is hollow and a vacuum means and said control means communicate with said shuttle arm assembly through the bore in said rod;
a θ motor assembly coupled to said z slide assembly disposed within said frame and movable along the longitudinal axis of said z slide assembly in response to selective control signals from said control means, for rotation of said shuttle arm between said wafer alignment position and said wafer test position in response to selective signals from said control means and a z motor assembly coupled to said shuttle arm to translate said shuttle arm in a plane perpendicular to said platform.

* * * * *